United States Patent
Platzgummer et al.

(10) Patent No.: US 10,522,329 B2
(45) Date of Patent: Dec. 31, 2019

(54) DOSE-RELATED FEATURE RESHAPING IN AN EXPOSURE PATTERN TO BE EXPOSED IN A MULTI BEAM WRITING APPARATUS

(71) Applicant: IMS Nanofabrication GmbH, Vienna (AT)

(72) Inventors: Elmar Platzgummer, Vienna (AT); Christoph Spengler, Vienna (AT); Wolf Naetar, Vienna (AT)

(73) Assignee: IMS Nanofabrication GmbH, Vienna (AT)

(*) Notice: Subject to any disclaimer, the term of this patent is extended or adjusted under 35 U.S.C. 154(b) by 0 days.

(21) Appl. No.: 16/105,699

(22) Filed: Aug. 20, 2018

(65) Prior Publication Data
US 2019/0066976 A1 Feb. 28, 2019

Related U.S. Application Data

(60) Provisional application No. 62/551,169, filed on Aug. 28, 2017.

(30) Foreign Application Priority Data

Aug. 25, 2017 (EP) .................................... 17187922

(51) Int. Cl.
  *H01J 37/00* (2006.01)
  *H01J 37/302* (2006.01)
  *H01J 37/317* (2006.01)

(52) U.S. Cl.
  CPC ...... *H01J 37/3026* (2013.01); *H01J 37/3177* (2013.01); *H01J 2237/24507* (2013.01);
  (Continued)

(58) Field of Classification Search
  CPC ............... H01J 37/3026; H01J 37/3177; H01J 2237/31764; H01J 2237/24507; H01J 2237/31774
  (Continued)

(56) References Cited

U.S. PATENT DOCUMENTS

| 1,033,741 A | 7/1912 | Sims |
| 1,420,104 A | 6/1922 | Howe et al. |

(Continued)

FOREIGN PATENT DOCUMENTS

| CN | 202204836 U | 4/2012 |
| EP | 0178156 A2 | 4/1986 |

(Continued)

OTHER PUBLICATIONS

Extended European Search Report for European Application No. 18150797.1, Search completed Jun. 29, 2018, dated Jul. 9, 2018, 8 Pgs.

(Continued)

*Primary Examiner* — Michael Maskell
(74) *Attorney, Agent, or Firm* — KPPB LLP

(57) ABSTRACT

A method for re-calculating a pattern to be exposed on a target by means of a charged-particle multi-beam writing apparatus is presented. The pattern elements of a pattern, initially associated with a respective assigned dose, are recalculated in view of obtaining reshaped pattern elements which have a nominal dose as assigned dose. The nominal dose represents a predefined standard value of exposure dose to be exposed for pixels during a scanning stripe exposure within the multi-beam apparatus. For the pattern elements associated with an assigned dose deviating from the nominal dose, the pattern element is reshaped by determining a reshape distance from the value of the assigned dose using a predefined dose slope function forming a reshaped pattern (Continued)

element, whose boundary is offset with regard to boundary of the initial pattern element by an offset distance equaling said reshape distance, assigning the nominal dose to the reshaped pattern element, and replacing the pattern element by the reshaped pattern element.

14 Claims, 22 Drawing Sheets

(52) U.S. Cl.
CPC .............. *H01J 2237/31764* (2013.01); *H01J 2237/31774* (2013.01)

(58) Field of Classification Search
USPC .......................................... 250/492.1–492.3
See application file for complete search history.

(56) References Cited

U.S. PATENT DOCUMENTS

| | | | |
|---|---|---|---|
| 1,903,005 A | 3/1933 | McCuen |
| 2,187,427 A | 1/1940 | Middleton |
| 2,820,109 A | 1/1958 | Dewitz |
| 2,920,104 A | 1/1960 | Brooks et al. |
| 3,949,265 A | 4/1976 | Holl |
| 4,467,211 A | 8/1984 | Smith |
| 4,735,881 A | 4/1988 | Kobayashi et al. |
| 4,899,060 A | 2/1990 | Lischke |
| 5,103,101 A | 4/1992 | Berglund et al. |
| 5,189,306 A | 2/1993 | Frei |
| 5,260,579 A | 11/1993 | Yasuda et al. |
| 5,369,282 A | 11/1994 | Arai et al. |
| 5,393,987 A | 2/1995 | Abboud et al. |
| 5,399,872 A | 3/1995 | Yasuda et al. |
| 5,533,170 A | 7/1996 | Teitzel et al. |
| 5,814,423 A | 9/1998 | Maruyama et al. |
| 5,841,145 A | 11/1998 | Satoh et al. |
| 5,847,959 A | 12/1998 | Veneklasen et al. |
| 5,857,815 A | 1/1999 | Bailey et al. |
| 5,866,300 A | 2/1999 | Satoh et al. |
| 5,876,902 A | 3/1999 | Veneklasen |
| 5,933,211 A | 8/1999 | Nakasugi et al. |
| 6,014,200 A | 1/2000 | Sogard et al. |
| 6,043,496 A | 3/2000 | Tennant |
| 6,049,085 A | 4/2000 | Ema |
| 6,107,636 A | 8/2000 | Muraki |
| 6,111,932 A | 8/2000 | Dinsmore |
| 6,137,113 A | 10/2000 | Muraki |
| 6,225,637 B1 | 5/2001 | Terashima et al. |
| 6,229,595 B1 | 5/2001 | McKinley |
| 6,252,339 B1 | 6/2001 | Kendall |
| 6,258,511 B1 | 7/2001 | Okino et al. |
| 6,280,798 B1 | 8/2001 | Ring et al. |
| 6,333,138 B1 | 12/2001 | Higashikawa et al. |
| 6,472,673 B1 | 10/2002 | Chalupka et al. |
| 6,473,237 B2 | 10/2002 | Mei |
| 6,552,353 B1 | 4/2003 | Muraki et al. |
| 6,617,587 B2 | 9/2003 | Parker |
| 6,768,123 B2 | 7/2004 | Giering |
| 6,768,125 B2 | 7/2004 | Platzgummer et al. |
| 6,829,054 B2 | 12/2004 | Stanke et al. |
| 6,835,937 B1 | 12/2004 | Muraki et al. |
| 6,858,118 B2 | 2/2005 | Platzgummer et al. |
| 6,897,454 B2 | 5/2005 | Sasaki et al. |
| 6,965,153 B1 | 11/2005 | Ono et al. |
| 7,084,411 B2 | 8/2006 | Lammer-Pachlinger et al. |
| 7,124,660 B2 | 10/2006 | Chiang |
| 7,129,024 B2 | 10/2006 | Ki |
| 7,199,373 B2 | 4/2007 | Stengl et al. |
| 7,201,213 B2 | 4/2007 | Leeson |
| 7,214,951 B2 | 5/2007 | Stengl et al. |
| 7,276,714 B2 | 10/2007 | Platzgummer et al. |
| 7,368,738 B2 | 5/2008 | Platzgummer et al. |
| 7,446,601 B2 | 11/2008 | LeChevalier |
| 7,459,247 B2 | 12/2008 | Bijnen et al. |
| 7,671,687 B2 | 3/2010 | LeChevalier |
| 7,683,551 B2 | 3/2010 | Miyamoto et al. |
| 7,687,783 B2 | 3/2010 | Platzgummer et al. |
| 7,710,634 B2 | 5/2010 | Sandstrom |
| 7,714,298 B2 | 5/2010 | Platzgummer et al. |
| 7,741,620 B2 | 6/2010 | Doering et al. |
| 7,772,574 B2 | 8/2010 | Stengl et al. |
| 7,777,201 B2 | 8/2010 | Fragner et al. |
| 7,781,748 B2 | 8/2010 | Platzgummer et al. |
| 7,823,081 B2 | 10/2010 | Sato et al. |
| 8,057,972 B2 | 11/2011 | Heinrich et al. |
| 8,115,183 B2 | 2/2012 | Platzgummer et al. |
| 8,178,856 B2 | 5/2012 | Nakayamada et al. |
| 8,183,543 B2 | 5/2012 | Platzgummer et al. |
| 8,198,601 B2 | 6/2012 | Platzgummer et al. |
| 8,222,621 B2 | 7/2012 | Fragner et al. |
| 8,227,768 B2 | 7/2012 | Smick et al. |
| 8,257,888 B2 | 9/2012 | Sczyrba et al. |
| 8,258,488 B2 | 9/2012 | Platzgummer et al. |
| 8,294,117 B2 | 10/2012 | Kruit et al. |
| 8,304,749 B2 | 11/2012 | Platzgummer et al. |
| 8,378,320 B2 | 2/2013 | Platzgummer |
| 8,502,174 B2 | 8/2013 | Wieland |
| 8,531,648 B2 | 9/2013 | Jager et al. |
| 8,546,767 B2 | 10/2013 | Platzgummer et al. |
| 8,563,942 B2 | 10/2013 | Platzgummer |
| 8,598,544 B2 | 12/2013 | Van De Peut et al. |
| 8,736,170 B1 | 5/2014 | Liu et al. |
| 8,859,983 B2 | 10/2014 | Wieland |
| 9,053,906 B2 | 6/2015 | Platzgummer |
| 9,093,201 B2 | 7/2015 | Platzgummer et al. |
| 9,099,277 B2 | 8/2015 | Platzgummer |
| 9,184,026 B2 | 11/2015 | Wieland |
| 9,188,874 B1 | 11/2015 | Johnson |
| 9,269,543 B2 | 2/2016 | Reiter et al. |
| 9,335,638 B2 | 5/2016 | Jager et al. |
| 9,373,482 B2 | 6/2016 | Platzgummer |
| 9,443,699 B2 | 9/2016 | Platzgummer et al. |
| 9,495,499 B2 | 11/2016 | Platzgummer et al. |
| 9,520,268 B2 | 12/2016 | Platzgummer |
| 9,568,907 B2 | 2/2017 | Platzgummer et al. |
| 9,653,263 B2 | 5/2017 | Platzgummer et al. |
| 9,691,589 B2 | 6/2017 | Van De Peut et al. |
| 9,799,487 B2 | 10/2017 | Platzgummer |
| 9,978,562 B2 | 5/2018 | Van De Peut et al. |
| 2001/0028038 A1 | 10/2001 | Hamaguchi et al. |
| 2002/0021426 A1 | 2/2002 | Mei et al. |
| 2002/0148978 A1 | 10/2002 | Innes et al. |
| 2003/0085360 A1 | 5/2003 | Parker et al. |
| 2003/0106230 A1 | 6/2003 | Hennessey |
| 2003/0155534 A1 | 8/2003 | Platzgummer et al. |
| 2003/0160980 A1 | 8/2003 | Olsson et al. |
| 2004/0058536 A1 | 3/2004 | Ki |
| 2004/0119021 A1 | 6/2004 | Parker et al. |
| 2004/0157407 A1 | 8/2004 | Qin-Yi et al. |
| 2004/0169147 A1 | 9/2004 | Ono et al. |
| 2005/0001178 A1 | 1/2005 | Parker et al. |
| 2005/0063510 A1 | 3/2005 | Hieronimi et al. |
| 2005/0072941 A1 | 4/2005 | Tanimoto et al. |
| 2005/0104013 A1 | 5/2005 | Stengl et al. |
| 2005/0242302 A1 | 11/2005 | Platzgummer et al. |
| 2005/0242303 A1 | 11/2005 | Platzgummer |
| 2006/0060775 A1 | 3/2006 | Sakakibara et al. |
| 2006/0076509 A1 | 4/2006 | Okino et al. |
| 2006/0169925 A1 | 8/2006 | Miyajima et al. |
| 2007/0138374 A1 | 6/2007 | Nishibashi et al. |
| 2007/0178407 A1 | 8/2007 | Hatakeyama et al. |
| 2007/0279768 A1 | 12/2007 | Shibazaki et al. |
| 2008/0024745 A1 | 1/2008 | Baselmans et al. |
| 2008/0080782 A1 | 4/2008 | Olsson et al. |
| 2008/0099693 A1 | 5/2008 | Platzgummer et al. |
| 2008/0105827 A1 | 5/2008 | Tamamushi |
| 2008/0128638 A1 | 6/2008 | Doering et al. |
| 2008/0142728 A1 | 6/2008 | Smick et al. |
| 2008/0198352 A1 | 8/2008 | Kugler et al. |
| 2008/0203317 A1 | 8/2008 | Platzgummer et al. |
| 2008/0212052 A1 | 9/2008 | Wagner et al. |
| 2008/0237460 A1 | 10/2008 | Fragner et al. |

(56) References Cited

U.S. PATENT DOCUMENTS

| | | |
|---|---|---|
| 2008/0257096 A1 | 10/2008 | Zhu et al. |
| 2008/0260283 A1 | 10/2008 | Ivansen |
| 2008/0283767 A1 | 11/2008 | Platzgummer |
| 2008/0299490 A1 | 12/2008 | Takekoshi |
| 2009/0032700 A1 | 2/2009 | Park et al. |
| 2009/0101816 A1 | 4/2009 | Noji et al. |
| 2009/0168043 A1 | 7/2009 | Lee |
| 2009/0200495 A1 | 8/2009 | Platzgummer et al. |
| 2009/0249266 A1* | 10/2009 | Pierrat .................. G03F 1/36 716/136 |
| 2009/0256075 A1 | 10/2009 | Kemen et al. |
| 2009/0321631 A1 | 12/2009 | Smick et al. |
| 2010/0124722 A1 | 5/2010 | Fragner et al. |
| 2010/0127185 A1 | 5/2010 | Fragner et al. |
| 2010/0127431 A1 | 5/2010 | Sandstrom |
| 2010/0178602 A1 | 7/2010 | Seto et al. |
| 2010/0187434 A1 | 7/2010 | Platzgummer et al. |
| 2010/0288938 A1 | 11/2010 | Platzgummer |
| 2011/0053087 A1 | 3/2011 | Nielsen et al. |
| 2011/0073782 A1 | 3/2011 | Wieland |
| 2011/0121208 A1 | 5/2011 | Nakayamada et al. |
| 2011/0204253 A1 | 8/2011 | Platzgummer et al. |
| 2011/0226968 A1 | 9/2011 | Platzgummer |
| 2012/0001097 A1 | 1/2012 | Yashima et al. |
| 2012/0007002 A1 | 1/2012 | Nakayamada et al. |
| 2012/0076269 A1 | 3/2012 | Roberts et al. |
| 2012/0085940 A1 | 4/2012 | Matsumoto |
| 2012/0151428 A1 | 6/2012 | Tanaka et al. |
| 2012/0211674 A1 | 8/2012 | Kato |
| 2012/0286169 A1 | 11/2012 | Van de Peut et al. |
| 2012/0286170 A1 | 11/2012 | Van de Peut et al. |
| 2012/0288787 A1 | 11/2012 | Choi et al. |
| 2012/0329289 A1 | 12/2012 | Fujimura et al. |
| 2013/0070222 A1 | 3/2013 | Fujimura |
| 2013/0120724 A1 | 5/2013 | Wieland et al. |
| 2013/0128247 A1 | 5/2013 | Khuat et al. |
| 2013/0157198 A1 | 6/2013 | Yoshikawa et al. |
| 2013/0164684 A1 | 6/2013 | Yamanaka |
| 2013/0198697 A1 | 8/2013 | Hotzel et al. |
| 2013/0201468 A1 | 8/2013 | Manakli |
| 2013/0252145 A1 | 9/2013 | Matsumoto et al. |
| 2013/0253688 A1 | 9/2013 | Matsumoto et al. |
| 2014/0042334 A1 | 2/2014 | Wieland |
| 2014/0158916 A1 | 6/2014 | Fujimura |
| 2014/0197327 A1 | 7/2014 | Platzgummer |
| 2014/0240732 A1 | 8/2014 | Tinnemans et al. |
| 2014/0264066 A1 | 9/2014 | Van De Peut et al. |
| 2014/0264086 A1 | 9/2014 | Van De Peut et al. |
| 2014/0322927 A1 | 10/2014 | Morita |
| 2014/0346369 A1 | 11/2014 | Matsumoto |
| 2015/0021493 A1 | 1/2015 | Platzgummer |
| 2015/0028230 A1 | 1/2015 | Platzgummer |
| 2015/0069260 A1 | 3/2015 | Platzgummer |
| 2015/0243480 A1 | 8/2015 | Yamada |
| 2015/0248993 A1 | 9/2015 | Reiter et al. |
| 2015/0311030 A1 | 10/2015 | Platzgummer et al. |
| 2015/0311031 A1 | 10/2015 | Platzgummer et al. |
| 2015/0347660 A1 | 12/2015 | Platzgummer et al. |
| 2016/0012170 A1 | 1/2016 | Platzgummer |
| 2016/0013019 A1 | 1/2016 | Platzgummer |
| 2016/0071684 A1 | 3/2016 | Platzgummer et al. |
| 2016/0276131 A1 | 9/2016 | Platzgummer |
| 2016/0276132 A1 | 9/2016 | Platzgummer |
| 2016/0336147 A1 | 11/2016 | Platzgummer |
| 2017/0357153 A1 | 12/2017 | Platzgummer |
| 2018/0218879 A1 | 8/2018 | Platzgummer et al. |

FOREIGN PATENT DOCUMENTS

| | | |
|---|---|---|
| EP | 0928012 A2 | 7/1999 |
| EP | 1033741 A2 | 9/2000 |
| EP | 1993118 A2 | 11/2008 |
| EP | 2019415 A1 | 1/2009 |
| EP | 2187427 A2 | 5/2010 |
| EP | 2190003 A2 | 5/2010 |
| EP | 2214194 A1 | 8/2010 |
| EP | 2312609 A1 | 4/2011 |
| EP | 2317535 A2 | 5/2011 |
| EP | 2363875 A1 | 9/2011 |
| EP | 2950325 A1 | 12/2015 |
| EP | 2993684 A1 | 3/2016 |
| EP | 3037878 A1 | 6/2016 |
| GB | 2349737 A | 11/2000 |
| JP | 08213301 A | 8/1996 |
| JP | 2006019436 A | 1/2006 |
| JP | 2006332289 | 12/2006 |
| JP | 2007172862 A | 7/2007 |
| JP | 2010098275 A | 4/2010 |
| WO | 2006084298 A1 | 8/2006 |
| WO | 2008053140 A1 | 5/2008 |
| WO | 2009147202 | 12/2009 |
| WO | 2012172913 A1 | 12/2012 |

OTHER PUBLICATIONS

Extended European Search Report for European Application No. 18154140.0, Search completed Aug. 16, 2018, dated Sep. 4, 2018, 5 Pgs.

"Dither", Wikipedia, Retrieved from https://en.wikipedia.org/w/index.php?title=Dither&oldid=762118152 on Oct. 5, 2017.

"Ordered dithering", Wikipedia, Retrieved from https://en.wikipedia.org/w/index.php?title=Ordered_dithering&oldid=759840417 on Oct. 5, 2017.

Berry et al., "Programmable aperture plate for maskless high-throughput nanolithography", J. Vac. Sci. Technol., Nov./Dec. 1997, vol. B15, No. 6, pp. 2382-2386.

Borodovsky, "EUV, EBDW—ARF Replacement or Extension?", KLA-Tencor Lithography User Forum, Feb. 21, 2010, San Jose, CA, USA, 21 pgs.

Borodovsky, "MPProcessing for MPProcessors", SEMATECH Maskless Lithography and Multibeam Mask Writer Workshop, May 10, 2010, New York, NY, USA, 35 pgs.

Disclosed Anonymously, "Multi-tone rasterization, dual pass scan, data path and cell based vector format", IPCOM000183472D, printed from ip.com PriorArtDatabase, published May 22, 2009, 108 pgs.

Hinterberger, "Ion optics with electrostatic lenses", University of Bonn, Germany, 2006, 18 pgs.

Huber et al., "Computing Straight Skeletons and Motorcycle Graphs: Theory and Practice", Thesis, Univ. of Salzburg (Austria) Jun. 2011, 134 pgs.

Kapl et al., "Characterization of CMOS programmable multi-beam blanking arrays as used for programmable multi-beam projection lithography and resistless nanopatterning", Journal of Micromechanics and Microengineering, vol. 21, Mar. 24, 2011, pp. 1-8.

Kim et al., "Binary-encounter-dipole model for electron-impact ionization", Phys. Rev. A, Nov. 1994, 50, 3954.

Li et al., "Through-Silicon Interposer Technology for Heterogeneous Integration", Future Fab Intl., Issue 45 (Apr. 25, 2013), 6 pgs.

Palfrader et al., "Computing Mitered Offset Curves Based on Straight Skeletons", Computer-Aided Design & Applications, vol. 12, No. 4, Feb. 11, 2015, pp. 414-424.

Paraskevopoulos et al., "Scalable (24—140 Gbps) optical data link, well adapted for future maskless lithography applications", Proc. SPIE vol. 7271, 2009, 11 pgs.

Platzgummer et al., "eMET—50keV electron Mask Exposure Tool Development based on proven multi-beam projection technology", Proc. of SPIE, 2010, vol. 7823, pp. 782308-1-782308-12.

Platzgummer et al., "eMET POC: Realization of a proof-of-concept 50 keV electron multibeam Mask Exposure Tool", Proc. of SPIE, 2011, vol. 8166, pp. 816622-1-816622-7.

Shih, "Image processing and mathematical morphology: fundamentals and applications", CRC Press, 2009, pp. 26-32.

Vink et al., "Materials with a high secondary-electron yield for use in plasma displays", Applied Physics Letters, Mar. 25, 2002, vol. 80, No. 12, pp. 2216-2218.

(56) References Cited

OTHER PUBLICATIONS

Wheeler et al., "Use of Electron Beams in VLSI", G.E.C. Journal of Science and Technology, General Electric Company. Wembley, Middlesex, GB, vol. 48, No. 2, Jan. 1, 1982, pp. 103-107, XP000820522.
Zhang et al., "Integrated Multi-Electron-Beam Blanker Array for Sub-10-nm Electron Beam Induced Deposition", J. Vac. Sci. Technol., Nov./Dec. 2006, vol. B24, No. 6, pp. 2857-2860.
European Search Report for Application 08450077.6, report dated Jan. 29, 2010, 2 pgs.
European Search Report for Application 09450211.9-1226, report dated Sep. 14, 2010; 4 pgs.
European Search Report for application 09450212.7, report dated Sep. 28, 2010, 9 pgs.
European Search Report for Application 141501197.7, report dated Jun. 6, 2014, 2 pgs.
European Search Report for Application 14165967, report dated Oct. 30, 2014, 2 pgs.
European Search Report for Application 14165970, report dated Jun. 18, 2014, 2 pgs.
European Search Report for Application 14170611, report dated Nov. 4, 2014, 3 pgs.
European Search Report for Application 14176563, report dated Jan. 14, 2015, 2 pgs.
European Search Report for Application 14177851; report dated Oct. 16, 2014; 1 page.
European Search Report for Application 14199183, report dated Jun. 19, 2015, 2 pgs.
European Search Report for Application 15159397.7, report dated Sep. 28, 2015, 7 pgs.
European Search Report for Application 15159617.8, report dated Oct. 19, 2015, 3 pgs.
European Search Report for Application 15164770, report dated Sep. 18, 2015; 2 pgs.
European Search Report for Application 15164772, report dated Sep. 11, 2015, 2 pgs.
European Search Report for Application 15169632, report dated Oct. 20, 2015, 3 pgs.
European Search Report for Application 15171348, report dated Oct. 30, 2015, 2 pgs.
European Search Report for Application 14176645, report dated Dec. 1, 2014, 1 pg.
European Search Report for Application 16174185, report dated Dec. 6, 2016, 2 pgs.
European Search Report for Application 10450070.7, report dated May 7, 2012, 13 pgs.
European Search Report for Application 16160622, report dated Jul. 21, 2016, 3 pgs.
European Search Report for Application 16160621, report dated Oct. 5, 2016, 3 pgs.
European Search Report for Application 16169216.5, report dated Sep. 21, 2016, 12 pgs.
European Search Report for Application 17153506, report dated Oct. 5, 2017, 2 pgs.
European Search Report for Application 17187922.4, report dated Feb. 21, 2018, 7 pgs.
European Search Report for Application 17191553.1, report dated Mar. 22, 2018, 5 pgs.

\* cited by examiner

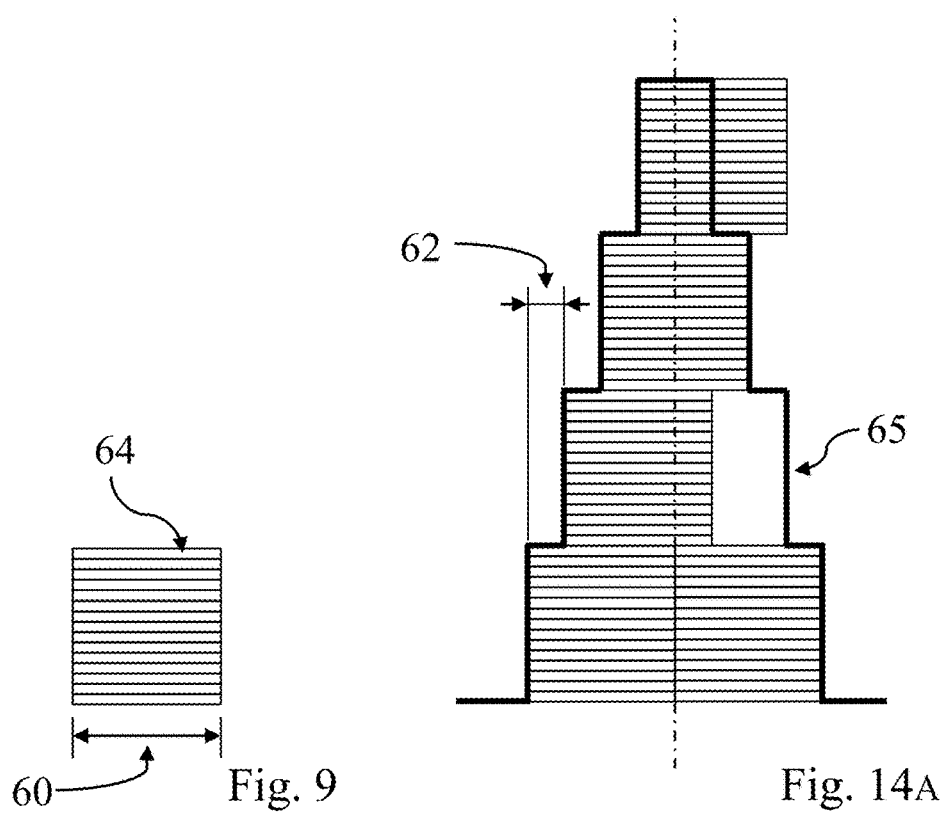
Fig. 9
Fig. 14A
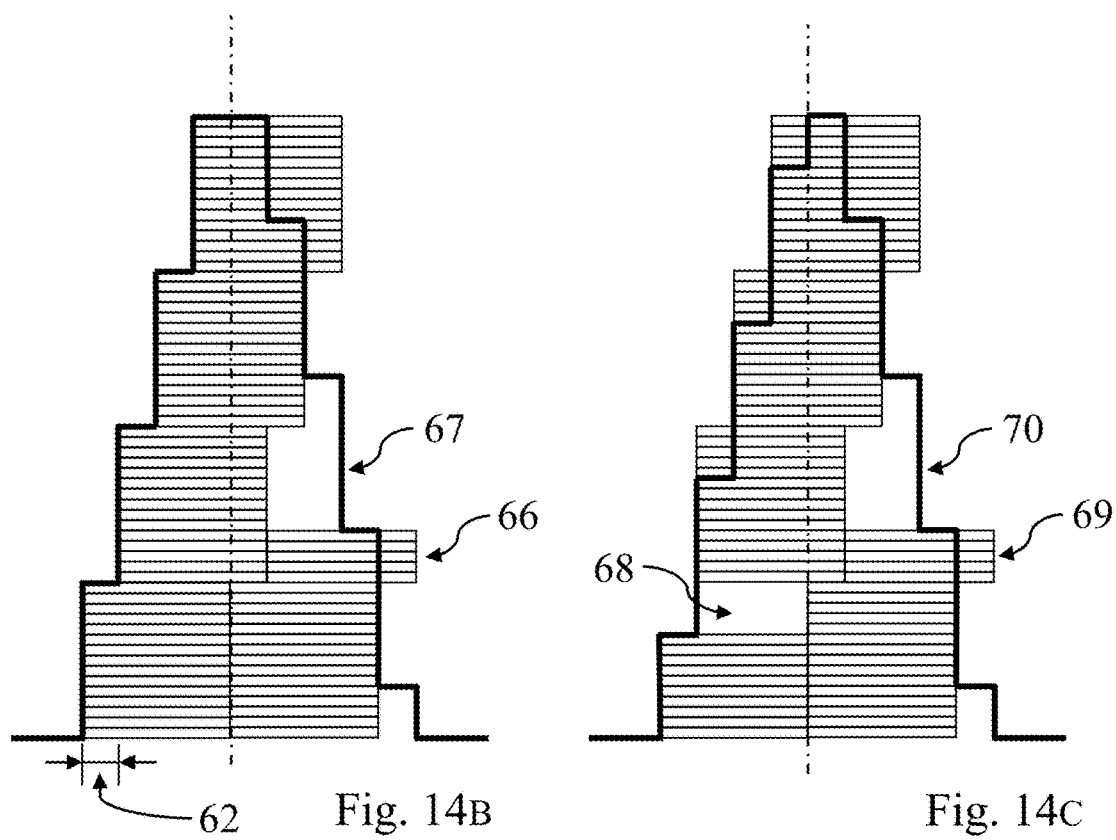
Fig. 14B
Fig. 14C

DOSE-RELATED FEATURE RESHAPING IN AN EXPOSURE PATTERN TO BE EXPOSED IN A MULTI BEAM WRITING APPARATUS

CROSS REFERENCE TO RELATED APPLICATIONS

This application claims priority to European Application No. 17187922.4 filed on Aug. 25, 2017, and U.S. Provisional Application No. 62/551,169 filed on Aug. 28, 2017, the disclosures of which are hereby incorporated by reference in their entireties.

FIELD OF THE INVENTION AND DESCRIPTION OF PRIOR ART

The invention relates to a method for re-calculating a pattern to be exposed on a target, in order to optimize the write performance of a charged-particle multi-beam writing apparatus employing a scanning stripe exposure. This type of apparatus exposes a multitude of pixels within an exposure region on the target in order to generate the pattern by means of a scanning stripe exposure where a structured beam composed of a plurality of beamlets is directed onto the target and moved along a path over the exposure region wherein between subsequent exposure steps the structured beam is shifted on the target by consecutive exposure lengths to have the plurality of beamlets expose consecutively different pixels, with the exposure length being smaller than the width of the structured beam on the target. The pattern initially comprises a number of pattern elements, wherein each pattern element has a respective shape comprising a boundary and an interior, and is associated with a respective assigned dose defining a value of exposure dose to be exposed for the pixels of the interior of the respective shape. For instance, the boundary may be thought of being composed of a set of boundary segments which together define a closed loop surrounding the interior.

Charged-particle multi-beam processing apparatuses of the mentioned type are well-known in prior art. In particular, the applicant has realized charged-particle multi-beam devices as described in several patents in the name of the applicant with respect to the charged-particle optics, pattern definition (PD) device, and multi-beam writing methods employed therein. For instance, a 50 keV electron multi-beam writer which allows to realize leading-edge complex photomasks for 193 nm immersion lithography, of masks for EUV lithography and of templates (1× masks) for imprint lithography, has been implemented, called eMET (electron Mask Exposure Tool) or MBMW (multi-beam mask writer), for exposing 6" mask blank substrates. Moreover, a multi-beam system also referred to as PML2 (Projection Mask-Less Lithography) was implemented for electron beam direct write (EBDW) applications on Silicon wafer substrates. The multi-beam processing apparatuses of the said kind are hereinafter referred to as multi-beam writer, or short MBW.

As a typical implementation of a MBW, the applicant has realized a 50 keV electron writer tool, which implemented a total beam size of 20 nm comprising 512×512 (=262,144) programmable beamlets within a beam array field of dimensions 81.92 µm×81.92 µm at the substrate. In this writer tool a typical type of substrate is a 6" mask blank (having an area of 6"×6"=152.4 mm×152.4 mm and thickness of e.g. 1"/4=6.35 mm) covered with an electron beam sensitive resist; furthermore, multi-beam writing is possible on resist-covered 150 mm Si wafers as well. Further information about this writer tool of the MBW type can be found in U.S. Pat. No. 9,653,263 of the applicant, which is herewith incorporated into this disclosure by reference. The MBW is configured to perform a writing method which herein is referred to as "scanning stripe exposure". The scanning stripe exposure writing method is discussed below inasmuch as needed in the context of the invention with reference to FIGS. 1 to 7; further details about scanning stripe exposure can be found in in U.S. Pat. No. 9,053,906 of the applicant, which is herewith incorporated into this disclosure by reference.

Another state-of-the-art writer technology which is used to expose a pattern, such as a mask pattern on a glass substrate, is the so-called VSB technology (variable shaped beam). The VSB technology is based on a sequential delivery of "shots" on the substrate whereas the shots are adjustable in size and the dose per shot is controllable by a high-speed blanker. Typically, the current density of an advanced VSB writer is very high (100-1000 A/cm$^2$), whereas in a MBW the current density is in the order of 1-4 A/cm$^2$. Thus, the VSB writer current density is higher by a factor of up to 1000 as compared to a MBW. The improved productivity of a MBW originates from the very large number of beams ("beamlets"), which is typically in the order of 250 thousand or more. Hence, a multi-beam writer can theoretically deliver up to 250 times higher current than a VSB writer, despite the lower current density, if the same beam size is applied. Considering all instrumental and physical limitations such as Coulomb interaction within the particles in the beams, the multi-beam writer can practically still deliver about 10-25 times more current than a VSB writer, which explains the improvement in productivity.

In spite of the increased total current, however, a MBW is limited with regard to the maximum current density of the individual beamlets. In the typical writing strategy of the MBW the beam is scanned within a certain cell area while the stage is scanned at constant velocity along one selected stage motion direction (see U.S. Pat. No. 9,053,906), and the maximal exposure time for a single location at the target in a MBW is determined by the beam scanning motion inherent to the method, regardless of whether the pattern requires an exposure dose or not. This limits the maximum exposure dose at a given location ('pixel') to a value determined by the local current density of the beamlets, multiplied by the cross-sectional area of the beamlet and the duration of exposure, and possibly a redundancy factor where multiple beamlets subsequently contribute to one pixel. For example, in the case that a pattern contains a feature to be exposed at a large dose, for the MBW it is required to increase the value of the maximum exposure by reducing the scanning velocity accordingly, even if the overall pattern density is low in the exposed pattern; hence this may severely limit the productivity.

In contrast, the VSB writer can locally deliver a very high dose by simply extending the blanker time with the beam vector-scanned across the surface (not addressing areas where there is no pattern) for the respective feature only. This aspect of VSB writers has been exploited for correcting sizes of certain features through adjusting the exposure dose of the feature—so-called "overdosing" (or "underdosing", depending on whether the dose of the relevant feature is raised or reduced). While from the viewpoint of lithography, overdosing (or underdosing) of features has little to no impact on the quality of exposure process, the state-of-the-art industrial user is used to VSB-based techniques where it is common to work with significant dose adjustments to correct for processing-related effects such as etching/erosion or pattern density related loading effects, wherein the specific amount of overdosing corresponds to the desired contraction or expansion of feature size, respectively. This may result in patterns where different pattern components have widely varying exposure dose levels, and in extreme cases, such dose adjustments can range from −40% underdosing up to +300% overdosing or more, relative to the so-called isofocal dose; where the term "isofocal dose" represents the value of exposure dose where a position of a contour between an area exposed at such exposure dose value and an area of zero exposure is independent of the amount of blur used in the respective lithography apparatus.

For a MBW, however, overdosing/underdosing techniques are disadvantageous for several reasons. For instance, in a worst-case scenario, overdosing may reduce the throughput of a multi-beam writer by a factor of up to factor 2 or 3, due to the required prolongation of the exposure time, which is determined by the maximum of the assigned dose in the pattern. Furthermore, the added current may lead to increased resist heating, which may influence writing accuracy drastically, e.g. due to target deformation. Since prior to exposure, it is typically required to represent dose assignments after PEC (proximity effect correction) by using a limited number of discrete gray levels, overdosing will imply a larger dose range, and consequently a larger dose step between gray levels (assuming the gray scale is limited to employ a fixed number of gray levels); this may cause a negative impact on the attainable placement accuracy in the pattern to be exposed.

Another issue arising from dose-based feature-size manipulation with regard to a MBW is associated with the fact that the blur of the single beamlets in a MBW system is generally considerably smaller than the blur in a VSB writer. Therefore, the gradient of dose near the edge of an exposure is higher in a MBW, and consequently the so-called "dose-slope" (i.e., the variation of position of an edge of a feature when incrementing the dose of the feature by a unit dose) is less steep; thus, the change of feature size as caused by a unit dose change is much smaller in a MBW than in a VSB writer. Therefore, the required change of dose may even be larger on a multibeam system than for a VSB tool to achieve the same effect. In an extreme case, underdosing may have the effect that for large targeted size reductions the assigned dose comes close to the dose-to-clear, which may eventually cause unwanted non-linear effects, edge roughness, or even pattern artifacts.

Yet another problem arises when strong over- or underdosing is performed in combination with the typical MBW writing mode using overlapping pixels. Namely, it was found that the change of CD by means of dosing depends on the location of the pattern relative to the physical grid. In particular, features whose edges coincide with the physical grid and features whose edges are relatively shifted by half the pitch of the physical grid are not resized equally by changing the dose. Thus, this writing-mode specific physical effect may also lead to a degradation of the CD uniformity.

Furthermore, the inventors noted that the dose-slope of a MBW system is often not constant across the beam-field, which would imply that a change of unit dose leads to a non-uniform change of feature size. This may eventually entail a degradation of critical dimension uniformity for all dose-settings other than the isofocal dose. In particular, this degradation scales with the magnitude of deviation of dose from the isofocal dose.

In summary, current state-of-the-art dose techniques to manipulate feature-sizes may be problematic for MBWs with regard to loss of quality and/or throughput.

Therefore, it is an object of the present invention to find a way to modify a pattern to improve the distribution of the assigned dose associated with the pattern element of the pattern, such that the values of assigned dose are compatible with the writing methods of a MBW, and in particular the scanning stripe exposure within a charged-particle multi-beam writing apparatus.

SUMMARY OF THE INVENTION

This object is achieved by a method for re-calculating a pattern of the kind as mentioned above, with regard to a nominal dose which represents a predefined standard value of exposure dose to be exposed for pixels of a maximal exposure as specified for the scanning stripe exposure within the underlying charged-particle multi-beam writing apparatus, wherein a reshaped pattern is generated from the pattern by substituting at least one reshaped pattern element for a corresponding pattern element; such a reshaped pattern element is generated for a pattern element associated with an assigned dose deviating from the nominal dose, the pattern element is reshaped by determining a reshape distance from the value of the assigned dose with regard to the nominal dose based on a predefined dose slope function, forming a reshaped pattern element, said reshaped pattern element having boundary segments which are offset with regard to the locations of corresponding boundary segments of the pattern element by an offset distance equaling said reshape distance and in a direction perpendicular to the respective segments, and assigning the nominal dose to the reshaped pattern element, and replacing the pattern element by the reshaped pattern element.

In other words, the invention applies an in-situ conversion to the pattern data and transforms those pattern elements that initially have deviant values of assigned doses to pattern elements which will be printable with the same dose as the rest of the pattern, while still delivering the intended dimension. This involves a size correction in accordance with a predefined dose slope for the pattern.

The invention allows to better exploit the benefits of a MBW with regard to increasing the productivity, in particular for cases where the dose assignment in the initial pattern to be exposed is larger than the exposure dose which is actually necessary. In fact it is not uncommon that a dose assignment is 2 or even 3 times larger than the "ideal dose" for a certain resist material. A typical value of the ideal dose is a dose-setting at or near the so-called isofocal dose, where "near" means with a deviation approximately within ±20%. The dose-to-clear of a resist, also referred to as threshold dose, is typically close to a 50% intensity of this ideal dose, as discussed further below. In the following, the term "nominal dose" is used for the "ideal dose", which generally corresponds to a setting that optimizes the write performance in relation to either speed or quality, or a specific trade-off between them.

Moreover, the invention enables improving the lithography quality of patterns that have been assigned with a dose smaller than the ideal dose for a certain resist material, the dose for example 90% or 80% of the ideal exposure dose.

Further advantages of the invention are:
1) Avoidance of throughput loss because the stage scanning speed is not limited by the maximum dose occurring in the selected pattern elements.
2) For a given dose resolution (gray levels) the line edge placement accuracy is increased, since the range between minimum and maximum exposure dose (i.e., the range of the dose window to be exposed) is reduced, which results in a finer distribution of the gray scale values available (so-called finer "address grid" of gray scale).

3) Where the selected pattern elements are to be underdosed (i.e., they are to be exposed with a dose lower than the ideal dose), non-linearity effects and/or contrast problems and related pattern degradation are avoided. Enlarging the dose while reducing the size of the selected pattern element was found to improve the printability of such features.

4) Highly improved placement accuracy for write modes using overlapping pixels. That is, degrading of critical dimension uniformity due to overdosing or underdosing relative to the isofocal dose can be reduced, or may even avoided, for those scenarios.

5) Improvement on overdosing. A common approach in the semiconductor industry uses certain data types or dose classes to compensate for etching/erosion effects, or similar effects that take place on a local scale (e.g. on scatter bars) and that may also depend on the local pattern arrangement and pattern density. Typically, metrology information is used to iteratively adjust parameters of the data types so as to meet the dimension goal of such features as finally obtained after the entire process chain, including a series of size modifications due to the process itself. This overdosing (or underdosing if applicable) has become a standard methodology in lithography for adjusting feature sizes and dimension based on actual versus designed dimensions. The re-shaping method according to the invention offers a largely equivalent alternative which avoids large dose differences within the pattern layer that would reduce writing throughput, in particular with a MBW.

As one suitable choice for the nominal dose, this parameter may be chosen such that it represents the maximal exposure dose which is attainable for pixels during the scanning stripe exposure within said charged-particle multi-beam writing apparatus.

A very suitable choice of the nominal dose is as the double of the positive exposure dose (also denoted $D_{DrC}$), which represents the minimal value of exposure dose which, when imparted to a pixel, is required to cause lithographic development of said pixel.

Another very suitable choice of the nominal dose is as the isofocal dose, which represents a value of exposure dose where a position of a contour between an area exposed at such exposure dose value and an area of zero exposition is independent of the amount of blur used during the scanning stripe exposure in the charged-particle multi-beam writing apparatus.

In an advantageous development of the invention, the step of determining a reshape distance is performed based on a predefined dose slope function which describes the reshape distance as a function of the value of the assigned dose relative to the nominal dose. This function may be taken as a linear function using a dose slope number, which in most cases of application gives a very good approximation to the actual dose slope relation. The dose slope function is determined in advance, for instance from experimental data and/or theoretical calculations (simulations).

In order to accelerate the reshaping method according to the invention, one suitable approach is to restrict a re-calculation of pattern elements to those whose assigned dose significantly deviate from the desired nominal dose. Thus, reshaping of a pattern element is done for (only) those pattern element which have an assigned dose deviating from the nominal dose by at least a predefined deviation factor relative to the nominal dose; wherein preferably said deviation is typically within a range of ±10%, but may be within ±20% for specific applications.

In one aspect of the invention wherein the boundary of a pattern element is composed of a set of boundary segments which together define a closed loop surrounding the interior, a suitable implementation of the step of forming a reshaped pattern element is based on an offsetting method. Thus this may include the steps of determining vertices of a polygon representation of the pattern element and angular bisectors at each of said vertices, calculating shifted vertices from said vertices, each of said shifted vertices being located at a shifted position such that the shifted vertex is at the reshape distance to the edges incident to the vertex, and forming a reshaped pattern element by joining the shifted vertices to a closed loop, defining a shape of the reshaped pattern element using the closed loop, and assigning the nominal dose to the reshaped pattern element.

In a variant aspect wherein the boundary of a pattern element is composed of a set of boundary segments which together define a closed loop surrounding the interior, the reshaping may be based on actually shifting the edges of the pattern elements, Thus, the step of forming a reshaped pattern element may include the steps of determining reshaped boundary segments as segments obtained from the boundary segments of the pattern element by shifting the locations of the segments by said reshape distance along respective directions perpendicular to the respective segments, and forming a reshaped pattern element by joining the reshaped boundary elements to a closed loop, defining a shape of the reshaped pattern element using the closed loop.

In another aspect, which may be alternative or in combination with the previous aspects, reshaping of pattern elements may be done with regard to a pixel representation of the pattern. In this case, the step of forming a reshaped pattern element may include detecting the locations of edges in the pixel representation and shifting the locations of the edges thus detected by said reshape distance along respective directions perpendicular to the respective edges. Alternatively or in combination, the step of forming a reshaped pattern element may include a combination of grayscale dilation and grayscale erosion steps to change a contour of the pattern element in said pixel representation by said reshape distance. The two approaches may be combined, for instance by applying them to different subsets of the pattern elements.

One important special case of the invention relates to an implementation with regard to a writing process for the pattern to be written where the writing process generates aperture images on the target such that the aperture images of subsequent exposure steps are mutually overlapping, and the aperture images have a (common) nominal width which is a multiple (wherein multiple means by a factor >1, preferably an integer multiple >1) of the distance between pixel positions of neighboring aperture images generated on the target. In this context, the method may further have the additional step of generating, from the reshaped pattern, a pixel exposure pattern suitable to expose the desired pattern by said writing process through exposure of pixels on the target by means of said aperture images.

The invention is particularly suitable for the mentioned scanning stripe exposure method, wherein the exposure length, applied as an offset distance between subsequent exposure steps, is uniform, and the exposure length corresponds to a multiple of at least two, preferably integer multiple, of the spacing between neighboring beamlets along the direction of the exposure length in the structured beam, so as to have the plurality of beamlets expose consecutively different pixels whereas pixels in the exposure region are exposed by a sequence of beamlets during subsequent exposure steps.

BRIEF DESCRIPTION OF THE DRAWINGS

In the following, in order to further demonstrate the present invention, illustrative and non-restrictive embodiments are discussed, as shown in the drawings, which schematically show:

FIG. 8A: "Double Grid", FIG. 8B: "Quad Grid", and FIG. 8C: "Double-Centered Grid";

FIG. 9 illustrate the intensity profile which is generated when one single exposure spot is exposed with a maximum dose;

FIG. 14A illustrates the intensity profile generated from the exposure of a line of a determined width;

FIGS. 14B,C illustrate the fine adjustment of the position of one edge (FIG. 14B) or both edges (FIG. 14C) of the line of FIG. 14A via suitable modifications of the dose levels corresponding the exposure spots;

FIG. 15A shows the effect of increasing the intensity distribution by 4%, leading to a line edge shift of 0.43 nm, whereas

FIG. 23A shows a dose profiles of pattern elements as given initially.

DETAILED DESCRIPTION OF EMBODIMENTS OF THE INVENTION

The detailed discussion of exemplary embodiments of the invention given below discloses the basic concepts and further advantageous developments of the invention. It will be evident to the person skilled in the art to freely combine several or all of the embodiments discussed here as deemed suitable for a specific application of the invention. Throughout this disclosure, terms like "advantageous", "exemplary", "preferably" or "preferred" indicate elements or dimensions which are particularly suitable (but not essential) to the invention or an embodiment thereof, and may be modified wherever deemed suitable by the skilled person, except where expressly required. It will be appreciated that the invention is not restricted to the exemplary embodiments discussed in the following, which are given for illustrative purpose and merely present suitable implementations of the invention.

Lithographic Apparatus

Figure 1:
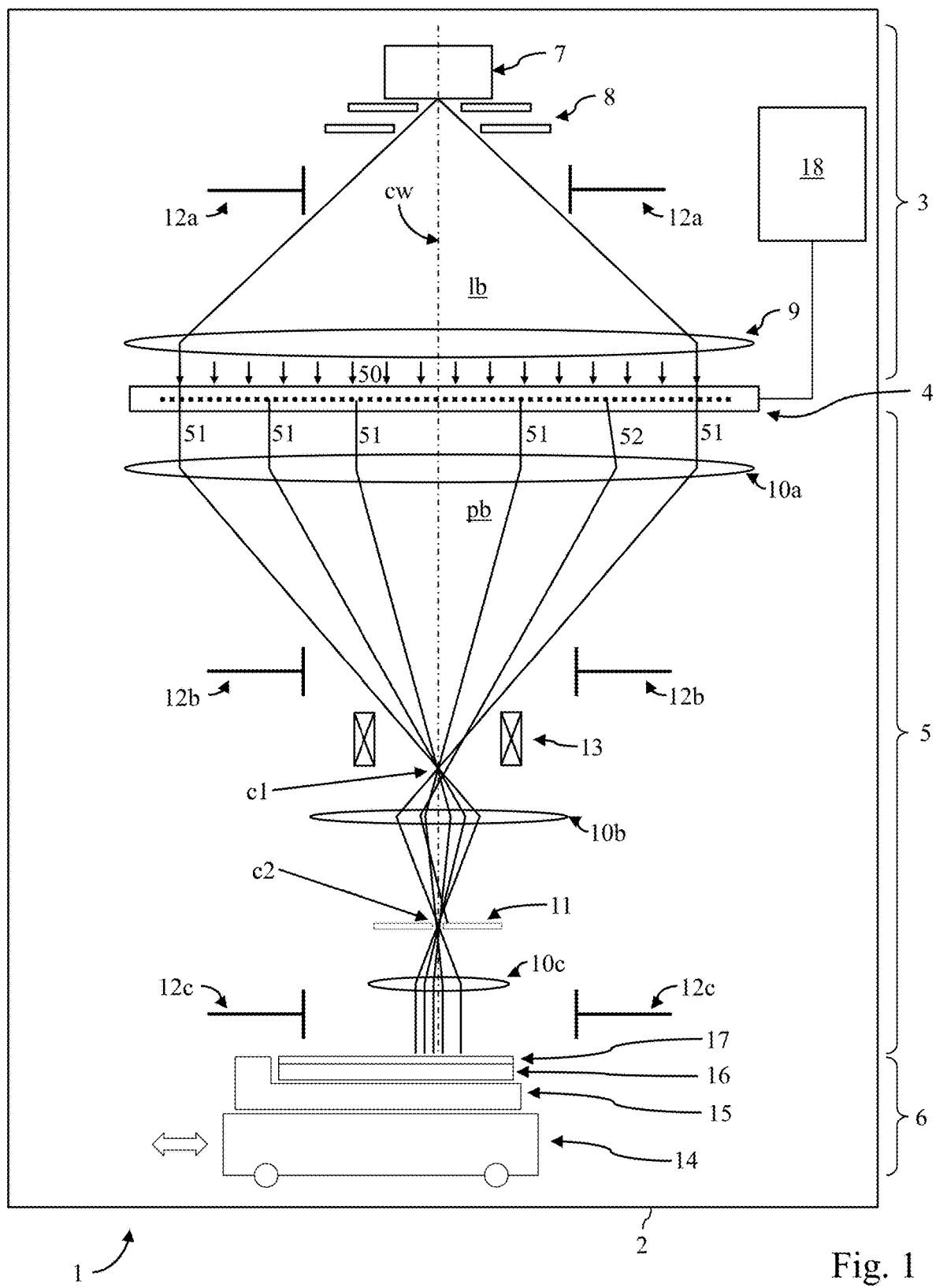
FIG. 1 a lithographic system of state of the art in a longitudinal sectional view.

An overview of a lithographic apparatus suitable to employ the preferred embodiment of the invention is shown in FIG. 1. In the following, only those details are given as needed to disclose the invention; for the sake of clarity, the components are not shown to size in FIG. 1. The main components of the lithography apparatus 1 are—corresponding to the direction of the lithography beam lb, pb which in this example runs vertically downward in FIG. 1—an illumination system 3, a pattern definition (PD) system 4, a projecting system 5, and a target station 6 with the substrate 16. The whole apparatus 1 is contained in a vacuum housing 2 held at high vacuum to ensure an unimpeded propagation of the beam lb, pb of charged particles along the optical axis cw of the apparatus. The charged-particle optical systems 3, 5 are realized using electrostatic and/or magnetic lenses.

The illumination system 3 comprises, for instance, an electron gun 7, an extraction system 8 as well as a condenser lens system 9. It should, however, be noted that in place of electrons, in general, other electrically charged particles can be used as well. Apart from electrons these can be, for instance, hydrogen ions or heavier ions, charged atom clusters, or charged molecules.

The extraction system 8 accelerates the particles to a defined energy of typically several keV, e.g. 5 keV. By means of a condenser lens system 9, the particles emitted from the source 7 are formed into a broad, substantially telecentric particle beam 50 serving as lithography beam lb. The lithography beam lb then irradiates a PD system 4 which comprises a number of plates with a plurality of openings (also referred to as apertures). The PD system 4 is held at a specific position in the path of the lithography beam lb, which thus irradiates the plurality of apertures and/or openings and is split into a number of beamlets.

Some of the apertures/openings are "switched on" or "open" so as to be transparent to the incident beam in the sense that they allow the portion of the beam that is transmitted through it, i.e. the beamlets 51, to reach the target; the other apertures/openings are "switched off" or "closed", i.e. the corresponding beamlets 52 cannot reach the target, and thus effectively these apertures/openings are non-transparent (opaque) to the beam. Thus, the lithography beam lb is structured into a patterned beam pb, emerging from the PD system 4. The pattern of switched on apertures—the only portions of the PD system 4 which are transparent to the lithography beam lb—is chosen according to the pattern to be exposed on the substrate 16 covered with charged-particle sensitive resist 17. It has to be noted that the "switching on/off" of the apertures/openings is usually realized by a suitable type of deflection means provided in one of the plates of the PD system 4: "Switched off" beamlets 52 are deflected off their path (by sufficient albeit very small angles) so they cannot reach the target but are merely absorbed somewhere in the lithography apparatus, e.g. at an absorbing plate 11.

The pattern as represented by the patterned beam pb is then projected by means of an electro-magneto-optical projection system 5 onto the substrate 16 where the beam forms an image of the "switched-on" apertures and/or openings. The projection system 5 implements a demagnification of, for instance, 200:1 with two crossovers c1 and c2. The substrate 16 is, for instance, a 6" mask blank or a silicon wafer covered with a particle sensitive resist layer 17. The substrate is held by a chuck 15 and positioned by a substrate stage 14 of the target station 6.

The information regarding the pattern to be exposed is supplied to the PD system 4 by the data path realized by means of an electronic pattern information processing system 18. Further details of the data path are given in the section "Data Path" below.

In the embodiment shown in FIG. 1, the projection system 5 is composed of a number of consecutive electro-magneto-optical projector stages 10a, 10b, 10c, which preferably include electrostatic and/or magnetic lenses, and possibly other deflection means. These lenses and means are shown in symbolic form only, since their application is well known in the prior art. The projection system 5 employs a demagnifying imaging through crossovers c1, c2. The demagnification factor for both stages is chosen such that an overall demagnification of several hundred results, e.g. 200:1 reduction. A demagnification of this order is in particular suitable with a lithography setup, in order to alleviate problems of miniaturization in the PD device.

In the whole projection system 5, provisions are made to extensively compensate the lenses and or deflection means with respect to chromatic and geometric aberrations. As a means to shift the image laterally as a whole, i.e. along a direction perpendicular to the optical axis cw, deflection means 12a, 12b and 12c are provided in the condenser 3 and projection system 5. The deflection means may be realized as, for instance, a multipole electrode system which is either positioned near the source extraction system 8 or one of the crossovers, as shown in FIG. 1 with the deflection means 12b, or after the final lens 10c of the respective projector, as in the case with the stage deflection means 12c in FIG. 1. In this apparatus, a multipole electrode arrangement is used as deflection means both for shifting the image in relation to the stage motion and for correction of the imaging system in conjunction with the charge-particle optics alignment system. These deflection means 12a, 12b, 12c are not to be confused with the deflection array means of the PD system 4 in conjunction with the stopping plate 11, as the latter are used to switch selected beamlets of the patterned beam pb "on" or "off", whereas the former only deal with the particle beam as a whole. There is also the possibility to rotate the ensemble of programmable beams using a solenoid 13 providing an axial magnetic field.

Figure 2:
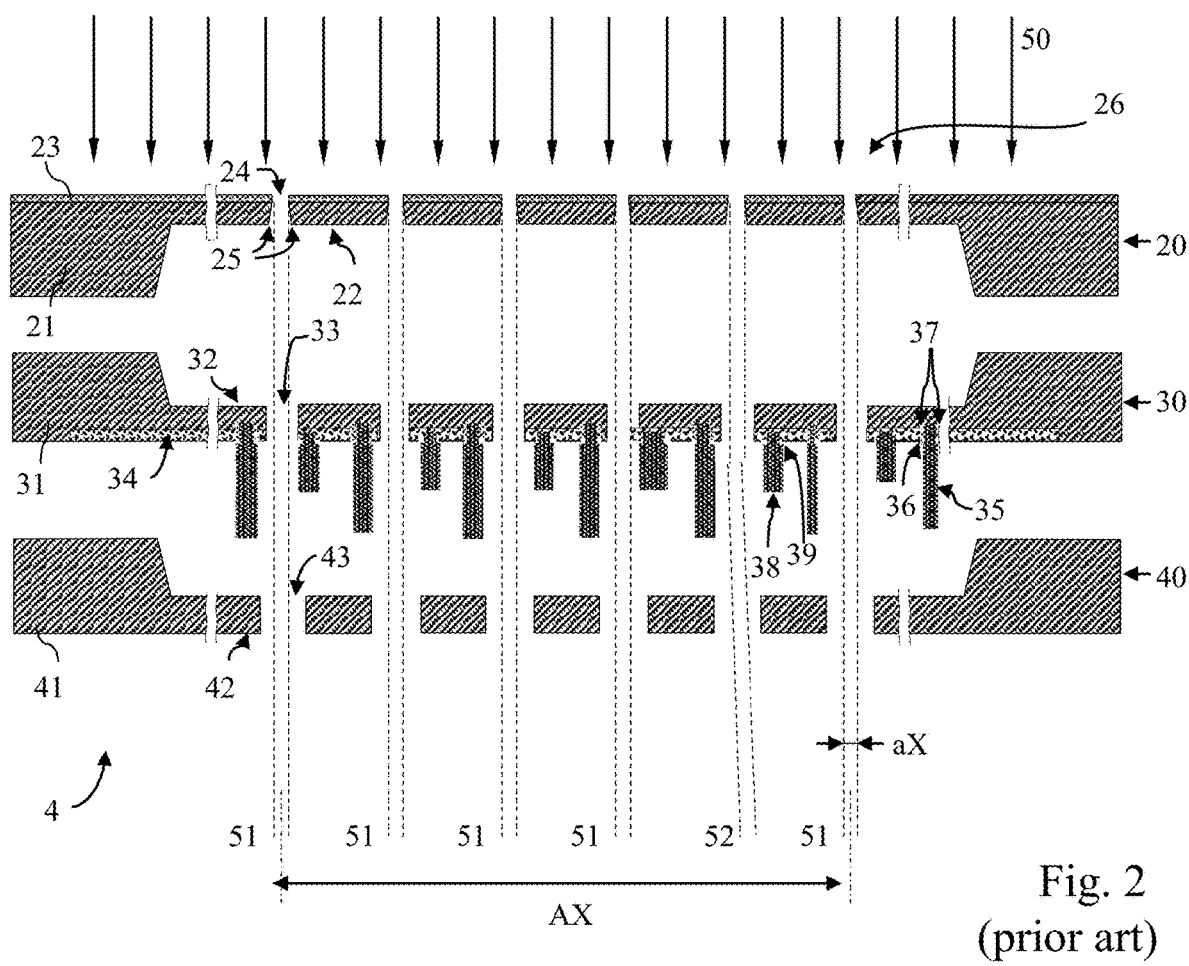
FIG. 2 a pattern definition system state of the art in a longitudinal section.

The sectional detail of FIG. 2 illustrates one suitable embodiment of a PD system 4, which comprises three plates stacked in a consecutive configuration: An "Aperture Array Plate" (AAP) 20, a "Deflection Array Plate" (DAP) 30 and a "Field-boundary Array Plate" (FAP) 40. It is worthwhile to note that the term 'plate' refers to an overall shape of the respective device, but does not necessarily indicate that a plate is realized as a single plate component even though the latter is usually the preferred way of implementation; still, in certain embodiments, a 'plate', such as the aperture array plate, may be composed of a number of sub-plates. The plates are preferably arranged parallel to each other, at mutual distances along the Z direction (vertical axis in FIG. 2).

The flat upper surface of AAP 20 forms a defined potential interface to the charged-particle condenser optics/illumination system 3. The AAP may, e.g. be made from a square or rectangular piece of a silicon wafer (approx. 1 mm thickness) 21 with a thinned center part 22. The plate may be covered by an electrically conductive protective layer 23 which will be particularly advantageous when using hydrogen or helium ions (like in U.S. Pat. No. 6,858,118). When using electrons or heavy ions (e.g. argon or xenon), the layer 23 may also be of silicon provided by the surface section of 21 and 22, respectively, so that there is no interface between layer 23 and the bulk parts 21, 22.

The AAP 20 is provided with a plurality of apertures 24 formed by openings traversing the thinned part 22. The apertures 24 are arranged in a predetermined arrangement within an aperture area provided in the thinned part 22, thus forming an aperture array 26. The arrangement of the apertures in the aperture array 26 may be, for instance, a staggered arrangement or a regular rectangular or square array (cf. FIG. 4). In the embodiment shown, the apertures 24 are realized having a straight profile fabricated into the layer 23 and a "retrograde" profile in the bulk layer of the AAP 20 such that the downward outlets 25 of the openings are wider than in the main part of the apertures 24. Both the straight and retrograde profiles can be fabricated with state-of-the-art structuring techniques such as reactive ion etching. The retrograde profile strongly reduces mirror charging effects of the beam passing through the opening.

The DAP 30 is a plate provided with a plurality of openings 33, whose positions correspond to those of the apertures 24 in the AAP 20, and which are provided with electrodes 35, 38 configured for deflecting the individual beamlets passing through the openings 33 selectively from their respective paths. The DAP 30 can, for instance, be fabricated by post-processing a CMOS wafer with an ASIC circuitry. The DAP 30 is, for instance, made from a piece of a CMOS wafer having a square or rectangular shape and comprises a thicker part 31 forming a frame holding a center part 32 which has been thinned (but may be suitably thicker as compared to the thickness of the thinned part 22). The aperture openings 33 in the center part 32 are wider compared to 24 (by approx. 2 µm at each side for instance). CMOS electronics 34 is provided to control the electrodes 35, 38, which are provided by means of MEMS techniques. Adjacent to each opening 33, a "ground" electrode 35 and a deflection electrode 38 are provided. The ground electrodes 35 are electrically interconnected, connected to a common ground potential, and comprise a retrograde part 36 to prevent charging and an isolation section 37 in order to prevent unwanted shortcuts to the CMOS circuitry. The ground electrodes 35 may also be connected to those parts of the CMOS circuitry 34 which are at the same potential as the silicon bulk portions 31 and 32.

The deflection electrodes 38 are configured to be selectively applied an electrostatic potential; when such electrostatic potential is applied to an electrode 38, this will generate an electric field causing a deflection upon the corresponding beamlet, deflecting it off its nominal path. The electrodes 38 as well may have a retrograde section 39 in order to avoid charging. Each of the electrodes 38 is connected at its lower part to a respective contact site within the CMOS circuitry 34.

The height of the ground electrodes 35 is higher than the height of the deflection electrodes 38 in order to suppress cross-talk effects between the beamlets.

The arrangement of a PD system 4 with a DAP 30 shown in FIG. 2 is only one of several possibilities. In a variant (not shown) the ground and deflection electrodes 35, 38 of the DAP may be oriented upstream (facing upward), rather than downstream. Further DAP configurations, e.g. with embedded ground and deflection electrodes, can be devised by the skilled person (see other patents in the name of the applicant, such as U.S. Pat. No. 8,198,601 B2).

The third plate 40 serving as FAP has a flat surface facing to the first lens part of the down-stream demagnifying charged-particle projection optics 5 and thus provides a defined potential interface to the first lens 10a of the projection optics. The thicker part 41 of FAP 40 is a square or rectangular frame made from a part of a silicon wafer, with a thinned center section 42. The FAP 40 is provided with a plurality of openings 43 which correspond to the openings 24, 33 of the AAP 20 and DAP 30 but are wider as compared to the latter.

The PD system 4, and in particular the first plate of it, the AAP 20, is illuminated by a broad charged particle beam 50 (herein, "broad" beam means that the beam is sufficiently wide to cover the entire area of the aperture array formed in the AAP), which is thus divided into many thousands of micrometer-sized beamlets 51 when transmitted through the apertures 24. The beamlets 51 will traverse the DAP and FAP unhindered.

As already mentioned, whenever a deflection electrode 38 is powered through the CMOS electronics, an electric field will be generated between the deflection electrode and the corresponding ground electrode, leading to a small but sufficient deflection of the respective beamlet 52 passing therethrough (FIG. 2). The deflected beamlet can traverse the DAP and FAP unhindered as the openings 33 and 43, respectively, are made sufficiently wide. However, the deflected beamlet 52 is filtered out at the stopping plate 11 of the sub-column (FIG. 1). Thus, only those beamlets which are unaffected by the DAP will reach the substrate.

The reduction factor of the demagnifying charged-particle optics 5 is chosen suitably in view of the dimensions of the beamlets and their mutual distance in the PD device 4 and the desired dimensions of the structures at the target. This will allow for micrometer-sized beamlets at the PD system whereas nanometer-sized beamlets are projected onto the substrate.

The ensemble of (unaffected) beamlets 51 as formed by AAP is projected to the substrate with a predefined reduction factor R of the projection charged-particle optics. Thus, at the substrate a "beam array field" (BAF) is projected having widths BX=AX/R and BY=AY/R, respectively, where AX and AY denote the sizes of the aperture array field along the X and Y directions, respectively. The nominal width of a beamlet at the substrate (i.e. aperture image) is given by bX=aX/R and bY=aY/R, respectively, where aX and aY denote the sizes of the beamlet 51 as measured along the X and Y directions, respectively, at the level of the DAP 30. Thus, the size of a single aperture image formed on the target is bX×bY.

It is worthwhile to note that the individual beamlets 51, 52 depicted in FIG. 2 represent a much larger number of beamlets, typically many thousands, arranged in a two-dimensional X-Y array. The applicant has, for instance, realized multi-beam charged-particle optics with a reduction factor of R=200 for ion as well as electron multi-beam columns with many thousands (e.g., 262,144) programmable beamlets. The applicant has realized such columns with a BAF of approx. 82 µm×82 µm at the substrate. These examples are stated for illustrative purpose, but are not to be construed as limiting examples.

Writing a Pattern

Figure 3:
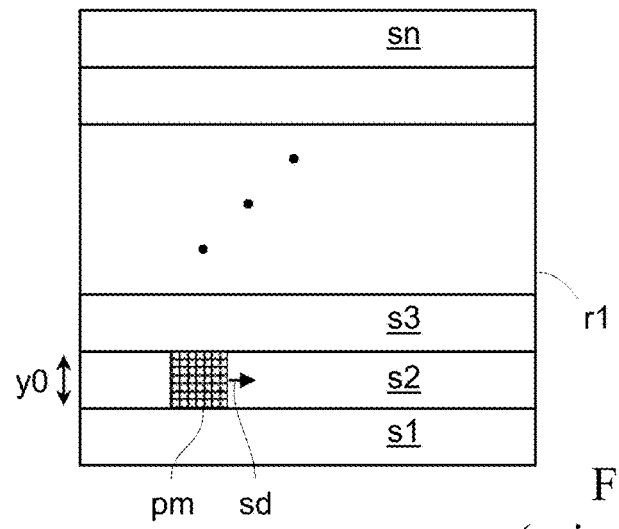
FIG. 3 illustrates the basic writing strategy on the target using stripes.

Referring to FIG. 3, a pattern image pm as defined by the PD system 4 is produced on the target 16. The target surface covered with the charged-particle sensitive resist layer 17 will comprise one or more areas r1 to be exposed. Generally, the pattern image pm exposed on the target has a finite size y0 which is usually well smaller than the width of the area r1 which is to be patterned. Therefore, a scanning stripe exposure strategy is utilized, where the target is moved under the incident beam, so as to change the position of the beam on the target perpetually: the beam is effectively scanned over the target surface. It is emphasized that for the purpose of the invention only the relative motion of the pattern image pm on the target is relevant. By virtue of the relative movement the pattern image pm is moved over the area r1 so as to form a sequence of stripes s1, s2, s3, . . . sn (exposure stripes) of width y0. The complete set of stripes covers the total area of the substrate surface. The scanning direction sd may have uniform orientation, or it may have alternate direction of movement from one stripe to the next.

Figure 5A:
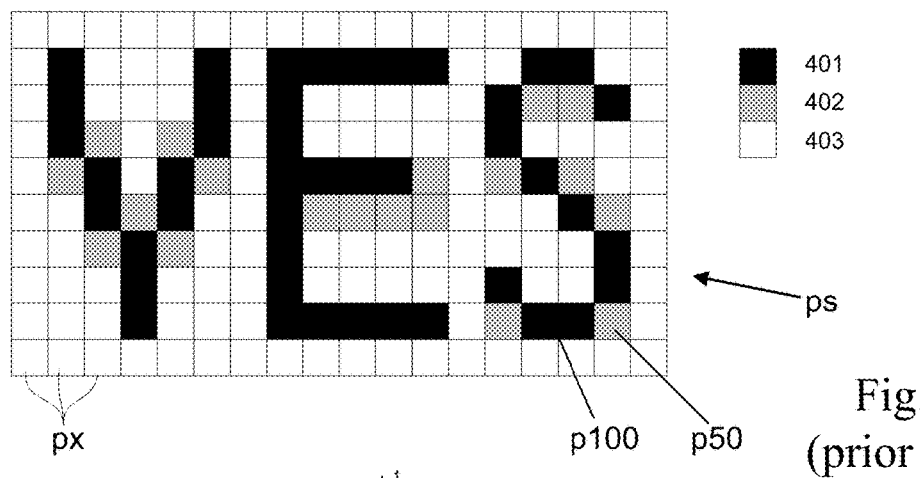
FIGS. 5A and 5B show an example of a pixel map of an exemplary pattern to be exposed.
Figure 5B:
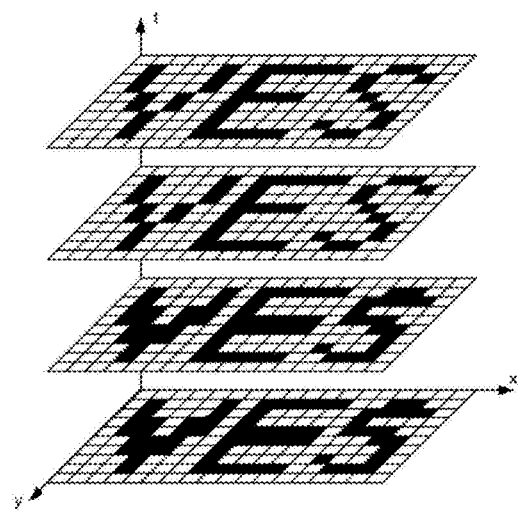

FIG. 5A shows a simple example of an imaged pattern ps with a size of 10×18=180 pixels, where some pixels p100 of the exposure area are exposed to a gray level 401 of 100% and other pixels p50 are exposed 402 to only 50% of the full gray level. The remaining pixels are exposed to a 0% dose 403 (not exposed at all). FIG. 5B illustrates how a 50% level is realized: each pixel is exposed several times, and for a pixel with a gray level between 0 and 100%, the gray level is realized by choosing a corresponding number of the exposures with the pixel activated; the gray level is the fraction of activated exposures over the total number of exposures. In this example, a 50% level is realized by choosing 2 out of 4. Of course, in a realistic application of the invention, the number of pixels of the standard image would be much higher. However, in FIGS. 5A+B the number of pixels is only 180 for the better clarity. Also, in general, much more gray levels will be used within the scale from 0% to 100%.

Thus, the pattern image pm (FIG. 3) is composed of a plurality of pattern pixels px, which are exposed with dose values according to the desired pattern to be exposed. It should be appreciated, however, that only a subset of the pixels px can be exposed simultaneously since only a finite number of apertures is present in the aperture field of the PD system. The pattern of switched-on apertures is chosen according to the pattern to be exposed on the substrate. Thus, in an actual pattern not all pixels are exposed at the full dose, but some pixels will be "switched off" in accordance with the actual pattern; for any pixel (or, equivalently, for every beamlet covering the pixel) the exposure dose can vary from one pixel exposure cycle to the next whether the pixel is "switched on" or "switched off", depending on the pattern to be exposed or structured on the target.

While the substrate 16 is moved continuously, the same image element corresponding to a pattern pixel px on the target may be covered many times by the images of a sequence of apertures. Simultaneously, the pattern in the PD system is shifted, step by step, through the apertures of the PD system. Thus, considering one pixel at some location on the target, if all apertures are switched on when they cover that pixel, this will result in the maximum exposure dose level: a "white" shade corresponding to 100%. In addition to a "white" shade, it is possible to expose a pixel at the target according to a lower dose level (also dubbed 'gray shade') which would interpolate between the minimal ('black') and maximal ('white') exposure dose levels. A gray shade may, for instance, be realized by switching on only a subset of apertures that may be involved in writing one pixel; for example, 4 out of 16 apertures would give a gray level of 25%. Another approach is reducing the duration of unblanked exposure for the apertures involved. Thus, the exposure duration of one aperture image is controlled by a gray scale code, for example an integer number. The exposed aperture image is the manifestation of one of a given numbers of gray shades that correspond to zero and the maximum exposure duration and dose level. The gray scale usually defines a set of gray values, for instance 0, $1/(n_y-1)$ . . . , $i/(n_y-1)$, . . . , 1 with $n_y$ being the number of gray values and i being an integer ("gray index", $0 \le i \le n_y$). Generally, however, the gray values need not be equidistant and form a non-decreasing sequence between 0 and 1.

Figure 4:
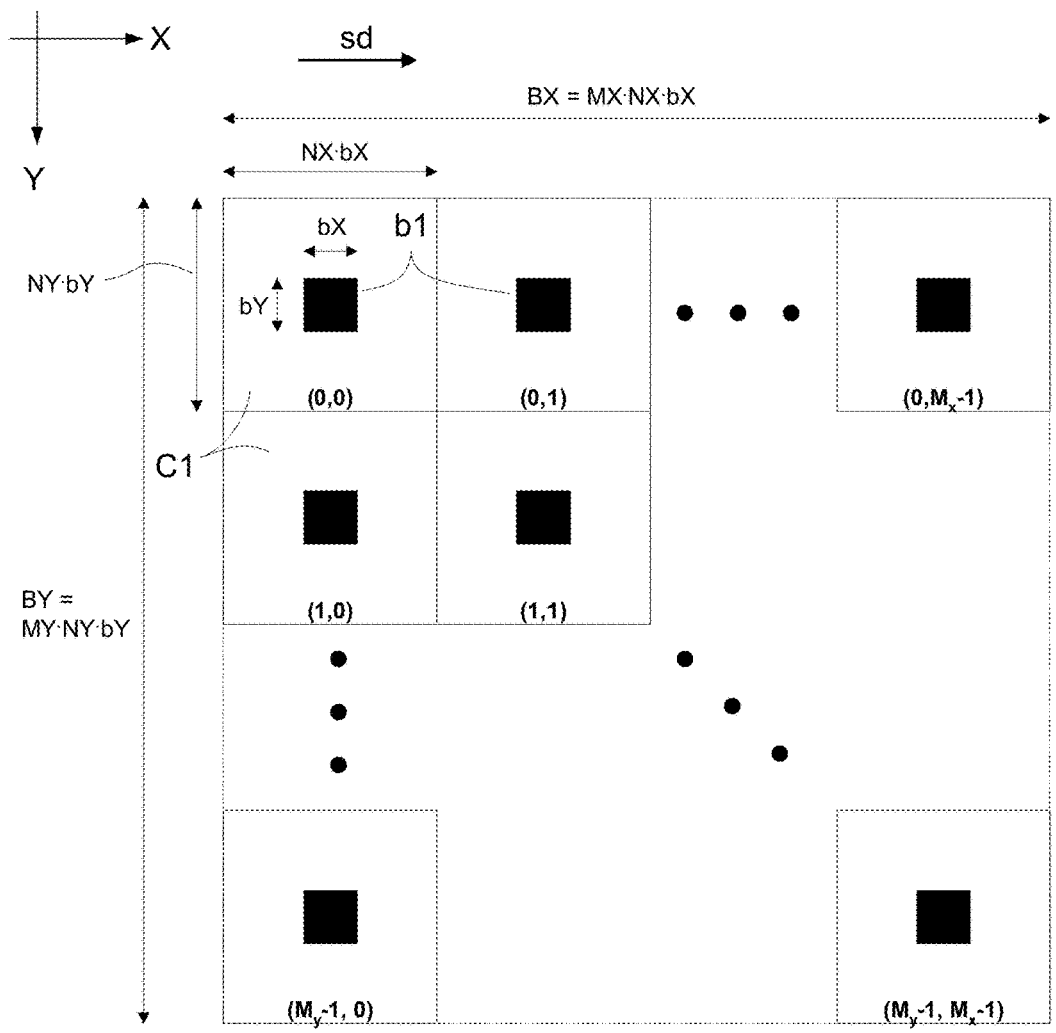
FIG. 4 shows an exemplary arrangement of apertures as imaged onto the target.

FIG. 4 shows the arrangement of apertures in the aperture field of the PD device, according to a basic layout and also illustrates several quantities and abbreviations used in the following. Shown is the arrangement of the aperture images b1 as projected onto the target, shown in dark shades. The main axes X and Y correspond to the direction of advance of the target motion (scanning direction sd) and the perpendicular direction, respectively. Each aperture image has widths bX and bY along the directions X and Y respectively. The apertures are arranged along lines and rows having MX and MY apertures, respectively, with the offset between neighboring apertures in a line and row being NX·bX and NY·bY respectively. As a consequence, to each aperture image belongs a conceptual cell C1 having an area of NX·bX·NY·bY, and the aperture arrangement contains MX·MY cells arranged in a rectangular way. In the following, these cells C1 are referred to as "exposure cells". The complete aperture arrangement, as projected onto the target, has dimensions of BX=MX·NX·bX by BY=MY·NY·bY. In the discussion hereinafter, we will assume a square grid as a special case of a rectangular grid, and set b=bX=bY, M=MX=MY, and N=NX=NY with M being an integer, for all further explanations without any restriction of the generality. Thus, an "exposure cell" has a size of N·b×N·b on the target substrate.

Figure 6A:
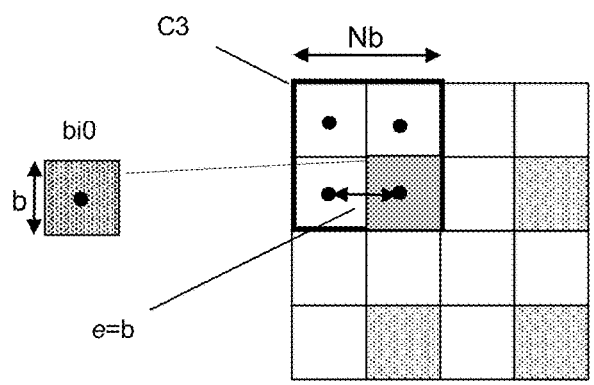
FIG. 6A illustrates an arrangement of apertures with M=2, N=2.

The pitch between two neighboring exposure positions is denoted as e in the following. In general, the distance e can be different from the nominal width b of an aperture image. In the simplest case, b=e, which is illustrated in FIG. 6A for the example of an arrangement of 2×2 exposure cells C3, and one aperture image bi0 covers (the nominal position of) one pixel. In another interesting case, illustrated in FIG. 6B (and in line with the teachings of U.S. Pat. No. 8,222,621 and U.S. Pat. No. 7,276,714), e may be a fraction b/o of the width b of the aperture image, with o>1 being preferably (but not necessarily) an integer which we also refer to as the oversampling factor. In this case the aperture images, in the course of the various exposures, will spatially overlap, allowing a higher resolution of the placement of the pattern to be developed. It follows that each image of an aperture will, at one time, cover multiple pixels, namely $o^2$ pixels. The entire area of the aperture field as imaged to the target will comprise $(NMo)^2$ pixels. From the point of view of placement of aperture image, this oversampling corresponds to a so-called placement grid which is different (since it is finer in spacing) than what would be necessary to simply cover the target area.

Figure 6B:
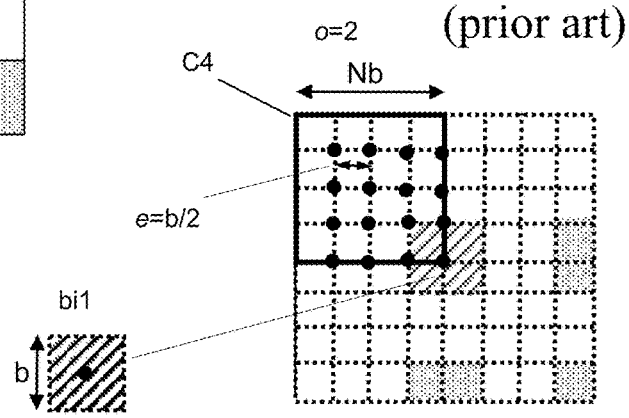
FIG. 6B shows an example of oversampling of the pixels in a "double grid" arrangement.

FIG. 6B illustrates one example of an oversampling of o=2 combined with placement grids, referred to as "double-grid": namely, the image of an aperture array with an exposure cell C4 having parameters o=2, N=2. Thus, on each nominal location (small square fields in FIG. 6B) four aperture images bi1 (dashed lines) are printed, which are offset on a regular grid by pitch e in both X and Y directions. While the size of the aperture image still is of the same value b, the pitch e of the placement grid is now b/o=b/2. The offset to the previous nominal location (offset of the placement grid) is also of size b/2. At the same time, the dose and/or the gray shade of each pixel may be adapted (reduced), by choosing a suitable gray value for the aperture image that cover the respective pixel. As a result, an area of size b×b is printed but with an enhanced placement accuracy due to the finer placement grid. Direct comparison of FIG.

6B with FIG. 6A shows that locations of aperture images are just arranged on a placement grid twice (generally, o times) as fine as before, while the aperture images themselves overlap. The exposure cell C4 now contains (No)² locations (i.e., "pixels") to be addressed during the write process and thus, by a factor of o², more pixels than before. Correspondingly, the area bi1 with the size of an aperture image b×b is associated with o²=4 pixels in the case of oversampling with o=2 in FIG. 6B (also called "double grid"). Of course, o may take any other integer value as well, in particular 4 ("quad grid", not shown) or 8. The parameter o may also be assigned a non-integer value greater one, such as $2^{1/2}=1.414$ or $2^{3/2}=2.828$, corresponding to the case of the "Double-Centered Grid" shown in U.S. Pat. No. 9,653,263.

It is worthwhile to note that with interlocking grids (o>1) it is possible to increase the number of gray shades by "dithering" while the dose distribution remains homogeneous. The basis for this is that the grey shades on any nominal grid are equal. This means that for the double interlocking grid the number of effective dose levels that can be realized is four times higher than for the non-interlocking grid. Generally speaking any oversampled exposure grid (i.e., o>1) consists of up to o² nominal grids shifted by distances b/o in X and Y direction. Thus, the step from one dose level to the next can be divided into o sub-steps where the dose level of only one of these o grids is increased; this can be repeated for the other grids until all sub-grids expose the nominal level. As the skilled person will appreciate, the beam shape at the substrate is the convolution of the machine blur and the reduced aperture shape of the aperture plate. It is possible to obtain a homogeneous dose distribution on the substrate by setting the width b to a natural multiple of the exposure grid constant e; in other words, making o=b/e an integer. Otherwise the dose distribution may have minima and maxima with a periodicity of the exposure grid, by virtue of aliasing effects. A high number of gray shades allows better feature placement. Therefore increasing the gray levels is of relevance where the gray shades per pixel position are limited to a certain number.

Figure 7A:
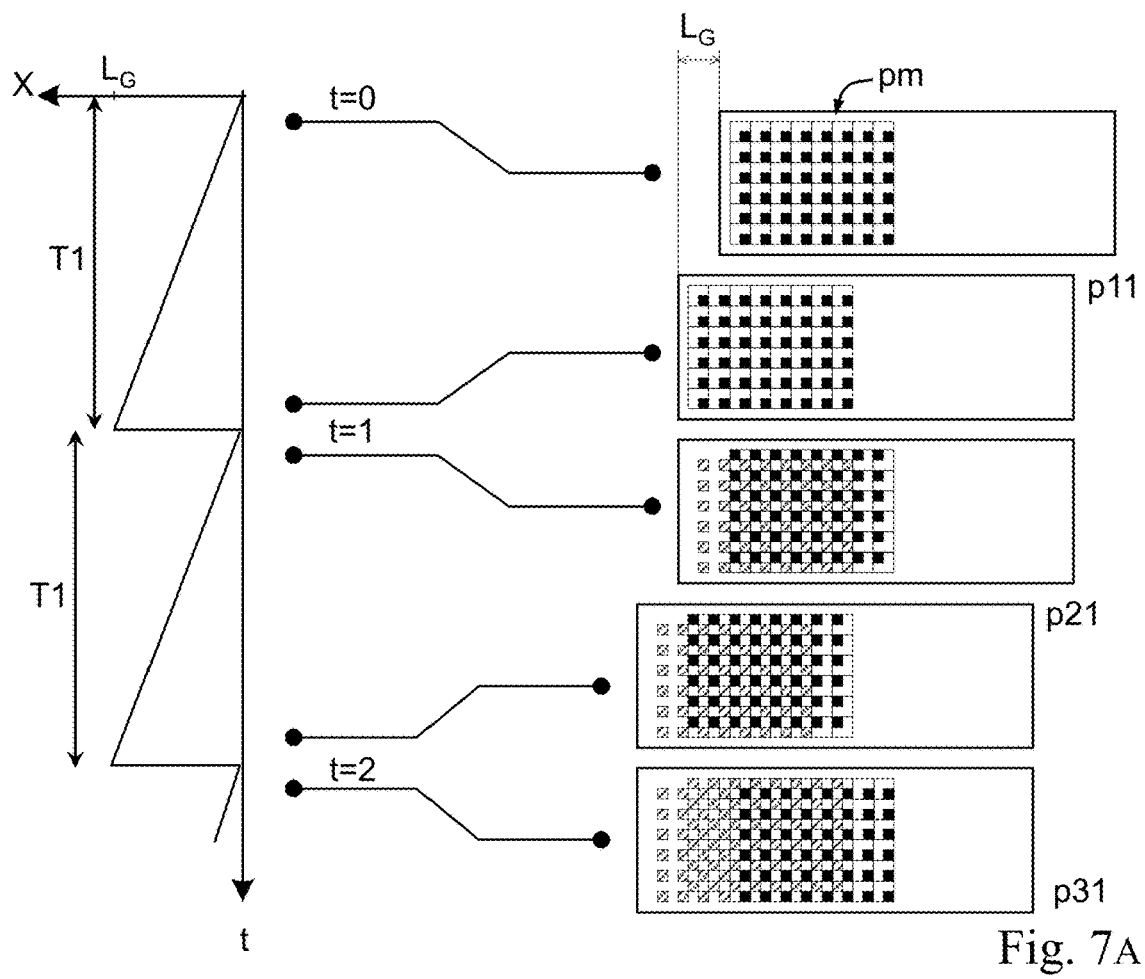
FIG. 7A illustrates the exposure of one stripe.

FIG. 7A shows an exposure scheme of the pixels, which is suitable for the scanning stripe exposure, which is preferably used with the invention. Shown is a sequence of frames, with increasing time from top (earlier) to bottom (later). The parameter values in this figure are o=1, N=2; also, a rectangular beam array is assumed with MX=8 and MY=6. The target moves continuously to the left, whereas the beam deflection is controlled with a seesaw function as shown on the left side of the figure. During each time interval of length T1, the beam image stays fixed on a position on the target (corresponding to a position of a "placement grid"). Thus, the beam image pm is shown to go through a placement grid sequence p11, p21, p31. One cycle of placement grids is exposed within a time interval L/v=NMb/v, by virtue of the target motion v. The time $T_1$ for exposure at each placement grid corresponds to a length, which we call "exposure length", given by $L_G=vT1=L/p=NMb/p$, where p denotes the number of exposure positions within a cell (p=No² for a regular oversampled grid).

The beamlets are moved over the distance of $L_G$ during the exposure of one set of image elements together with the target. In other words, all beamlets maintain a fixed position with regard to the surface of the substrate during the time interval T1. After moving the beamlets with the target along distance $L_G$, the beamlets are relocated instantaneously (within a very short time) to start the exposure of the image elements of the next placement grid. After a full cycle through the positions p11 . . . p31 of a placement grid cycle, the sequence starts anew, with an additional longitudinal offset L=bNM parallel to the X direction (scanning direction). At the beginning and at the end of the stripe the exposure method may not produce a contiguous covering, so there may be a margin of length L that is not completely filled.

It is remarked that FIG. 7A neglects the time needed for opening/closing the individual apertures according to the actual pattern. In reality the deflecting devices of the DAP and deflection multipole systems need a certain settling time interval $T_S$, to settle the status of the apertures after repositioning and fading out of transient oscillations. The settling time interval $T_S$ is a (very) small fraction of the pixel exposure cycle T1. Therefore, rather than the entire pixel exposure cycle T1, only a usable time $Tu=T1-T_S$ is used for the exposure of pixels. The time interval Tu is the pixel exposure period within which to ensure that the appropriate dose is passed to the respective pixels. In the following, however, it is assumed that Ts is negligible as compared to T1, and no discrimination is made between Tu and T1 hereinafter.

The usable exposure time Tu is divided into g time slots, corresponding to the number of gray shades possible to address. One value for g would be g=16 (4 bit). The pixel exposure is activated according to the desired gray shade, which is the sum of used time slots within Tu. If the dose applied to one pixel within the time Tu is digitized into g gray levels, it is possible to reload a general blanking cell g times during Tu; each blanking cell in the blanking array receives its individual gray shade during the exposure period T1 (or more accurately, the usable time Tu).

Figure 7B:
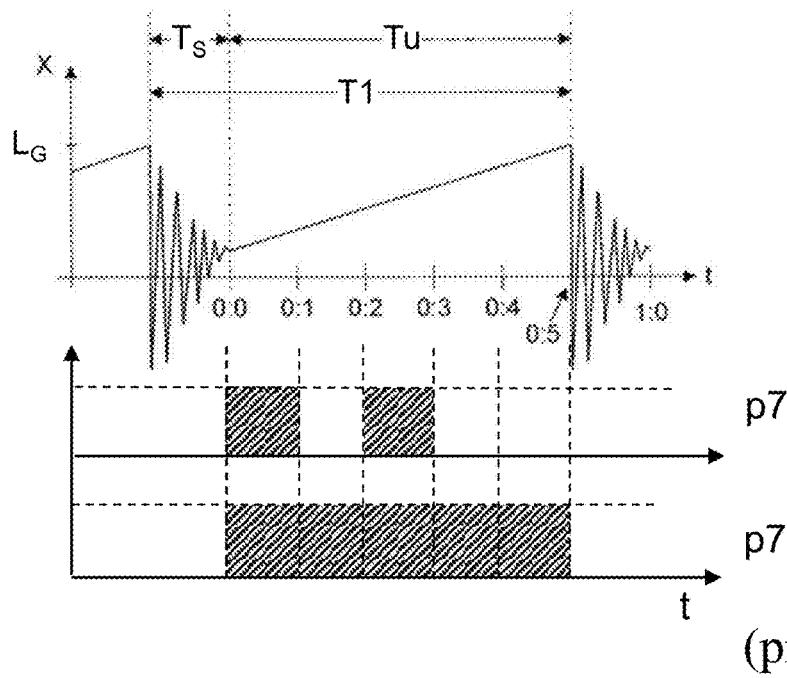
FIG. 7B illustrates the exposure of gray levels.

FIG. 7B illustrates the exposure of two pixels with different gray shades in a simplified example with g=5; the relative size of the settling time interval Ts is greatly exaggerated. In accordance with g=5 there are five time slots in each usable time interval Tu. A first pixel p72 is exposed at a gray shade at 100% (i.e., "black"), and a second pixel p71 at a gray shade of 40%. For pixel p71 two time slots of a corresponding blanking electrode generate a gray shaded pixel (since 40% corresponds to a gray shade with 2 out of 5), and two of the time slots—in arbitrary order—are set to switched-on. On the other hand, for pixel p72 the respective blanking electrode is activated during all five time slots, thus generating a black pixel with the maximum dose that may be deposited during Tu.

Exposure of Features in Double and Quad Grids

Figure 8A:
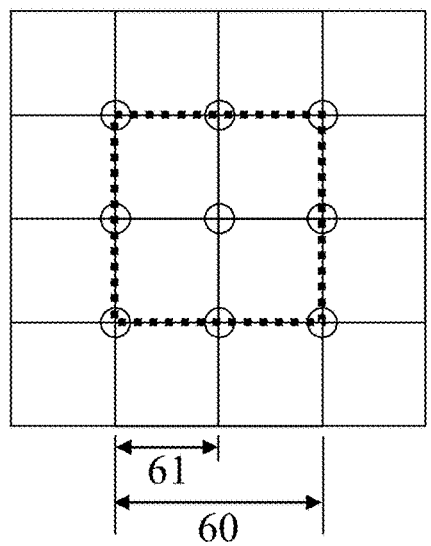
FIGS. 8A-C show three different cases of grid placements, namely
Figure 8B:
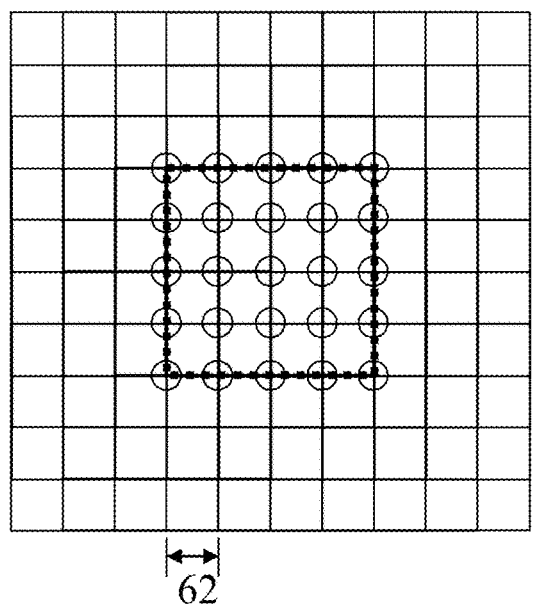
Figure 8C:
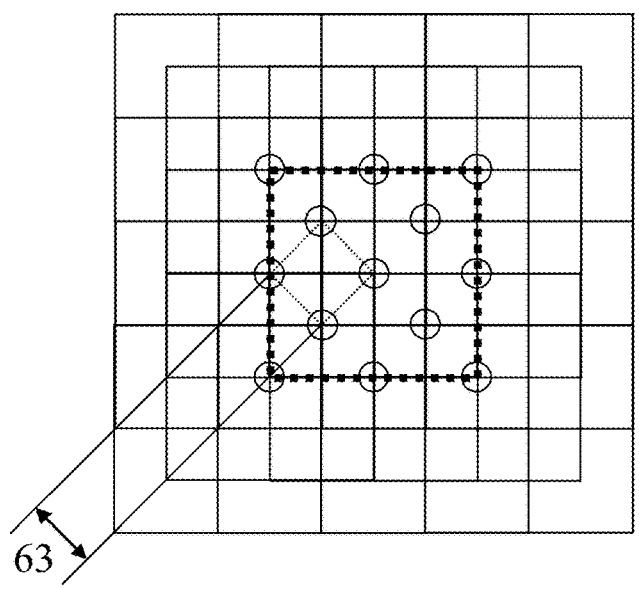

Referring to FIGS. 8A-8C, each exposure spot 60 corresponding to an aperture image bi0, bi1 (FIG. 6A,B) is exposed with discrete dose levels as will be discussed in more detail below. FIGS. 8A-C illustrate various overlap configurations of special interest.

FIG. 8A depicts the "Double Grid" multi-beam exposure as discussed above with FIG. 6B, where the overlap between the exposure spots is half of the beam spot size in the X and Y directions. In this case the physical grid size 61 is half of the linear size of the spots 60.

FIG. 8B illustrates a "Quad Grid" multi-beam exposure, where the overlap between the spots is ¼ of the beam spot size in the X and Y directions. In this case the physical grid size 62 is a quarter of the spot size width.

FIG. 8C depicts another grid layout, where in addition to Double Grid overlapping beam exposures, beam exposures are done in the centers in between. Therefore, the physical grid size 63 is $½^{3/2}$ (i.e., $\sqrt{2}/4$) of the linear spot size. This multi-beam exposure mode is called "Double-Centered Grid".

FIG. 9 shows a symbolic depiction ("brick-layer") of an intensity profile of one exposure spot (whose width is indicated as 60) which is exposed with a maximum dose level. In the exemplary case of a 4 bit coding, there are 16 dose levels (0, 1, 2, . . . 15), i.e. the maximum dose level is the sum of 15 dose level increments 64.

Figure 10:
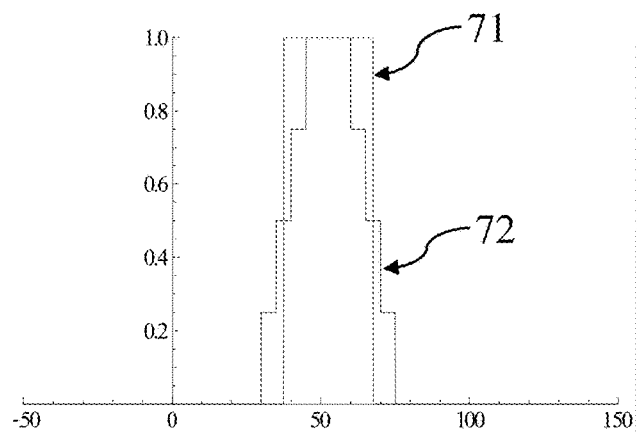
FIG. 10 illustrates an intensity profile of the MBW of the type shown in FIG. 1, and a dose level profile for a 30 nm line.
Figure 13:
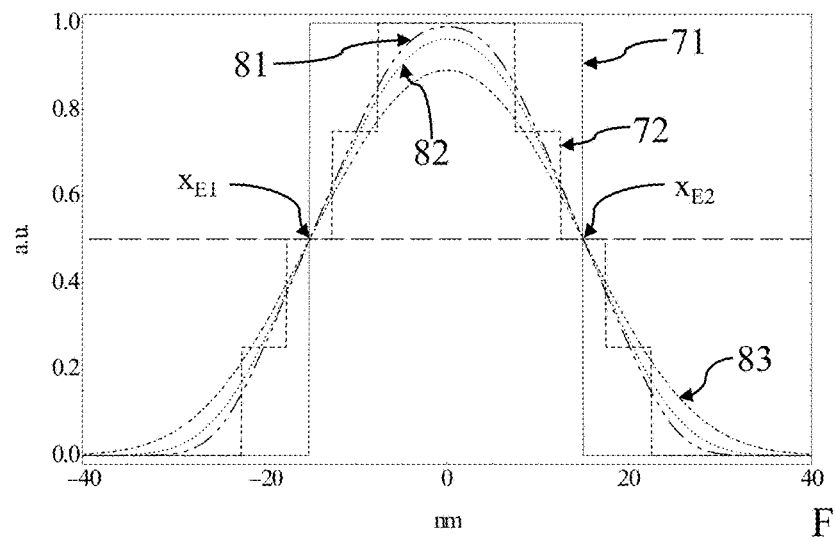
FIG. 13 illustrates the generation of a 30 nm line with the MBW.

FIG. 10 shows the ideal intensity profile 71 for a line of a width 30 nm, in the idealized case of zero blur. When using "Quad Grid" multi-beam exposure the overlap is a quarter of the beam size. Thus, for the case of 20 nm beam size the physical grid size is 5 nm. A discrete dose level can be assigned to each area of the physical grid, which is 5 nm×5 nm for the example chosen; the line 72 in FIG. 10 indicates the superposition of the intensity (or total dose) as it is composed by the overlapping exposure spots with discrete dose levels assigned to the pixel positions for generating the 30 nm line, whereas for better visibility the blur has been set to zero (so that the dose distribution of a single exposure spot becomes a rectangle). If the blur has a realistic value such as shown in FIG. 13, the step function at the edge of the rectangle is convoluted with a Gaussian function, which eventually transforms to a Gaussian shape. In that sense the line 72 can be seen as superposition of Gaussian functions at blur zero. In the general case the dose level histogram will not be symmetrical in order to position the left and right edge at pre-defined positions.

Figure 11:
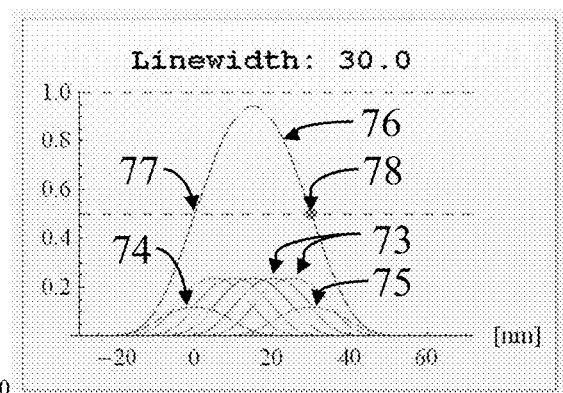
FIG. 11 shows an intensity profile for the 30 nm line dose level profile of FIG. 10.

FIG. 11 shows a simulation for a line of 30.0 nm width, with the left edge to be positioned at 0.0 nm and the right edge at 30.0 nm. For the simulation, it was assumed that beam spots of 20 nm are exposed with 5.1 nm 1 sigma blur (i.e., 12.0 nm FWHM blur). The intensity profile 76 is formed by overlapping the profiles of the exposure spots 73, 74, and 75. The dose level of the leftmost exposure spot 74 is adjusted such that the 30 nm line starts at the desired start position 77, i.e. at 0 nm. The dose level of the rightmost exposure spot 75 is adjusted such that exposed line ends at position 78 at 30.0 nm. As can be seen in FIG. 11, in accordance with "Quad Grid" exposure, the overlap of the exposure spots 73, 74, 75 is a quarter of the beam size, i.e. 5 nm.

Figure 12A:
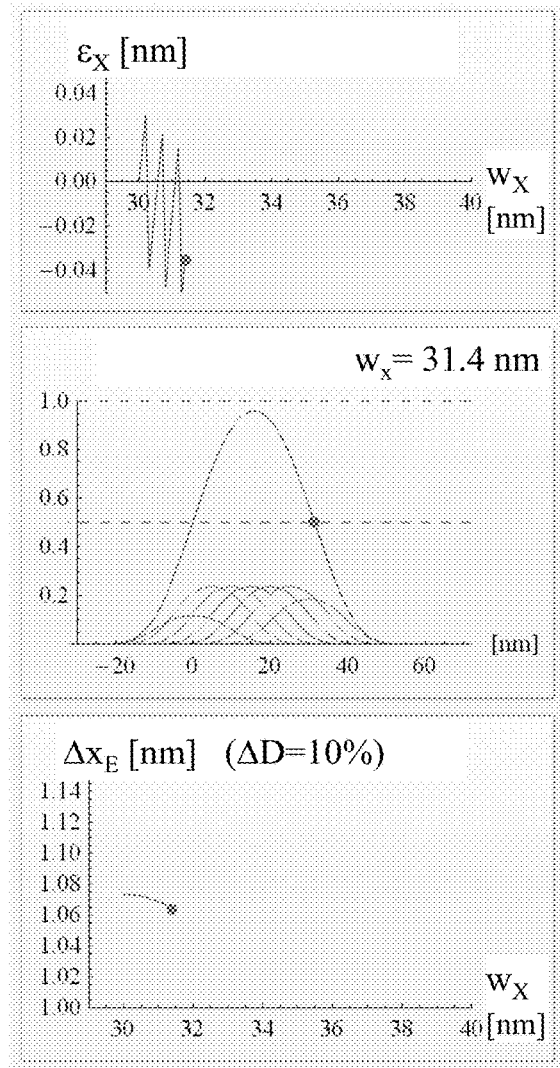
FIGS. 12A and 12B illustrate MBW intensity profiles and related data as obtained for a simulation of a line, with a line width of 31.4 nm (FIG. 12A) and 40.0 nm (FIG. 12B), respectively.
Figure 12B:
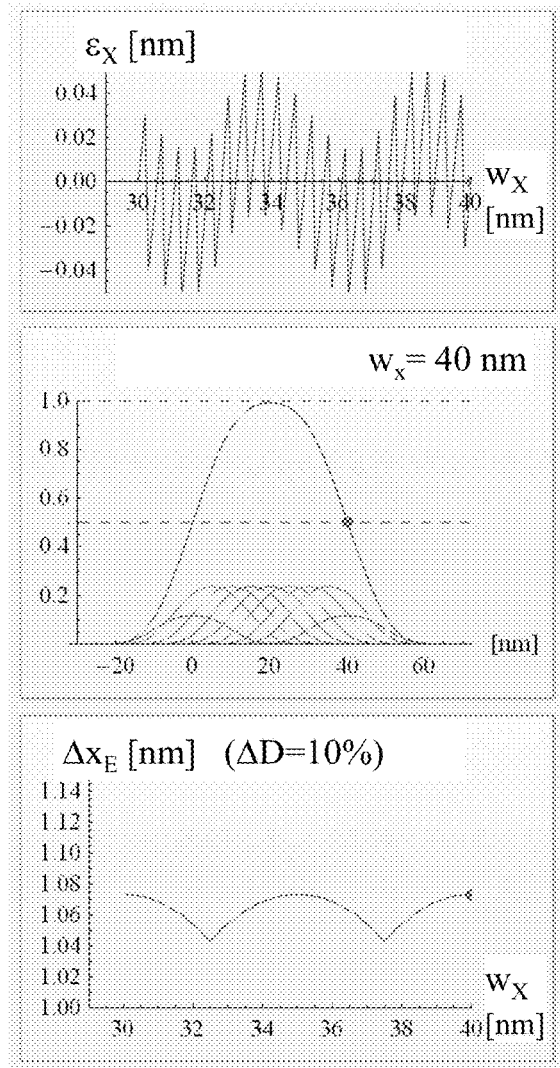

FIGS. 12A and 12B illustrate how the MBW writes lines with precise edge definitions; in each figure, the top frame shows the edge position error $\varepsilon_X$ vs. line width (both in nanometers), the middle frame the intensity profile (intensity in arbitrary units, for line width $w_X$ at 31.4 nm and 40 nm, respectively), and the bottom frame shows the edge position deviation $\Delta x_E$ when enhancing the exposure dose by 10% vs. line width. FIG. 12A shows the intensity profile obtained for a 31.4 nm line width, and FIG. 12B for a 40.0 nm line width. Using the MBW with 20 nm beam size and Quad Grid exposure (5 nm physical grid size), the line width of the structure generated by the exposure can be changed in steps of 0.1 nm. Because of the integer dose levels there are slight deviations from the 0.1 nm address grid. These deviations are indicated as "edge position error" $\varepsilon_X$ (top frames), as functions of the desired line width $w_X$, in 0.1 nm steps between 30.0 nm and 40.0 nm. As can be seen the deviations are within ±0.05 nm. Furthermore, the change of edge position, $\Delta x_E$, with 10% change of dose is only approx. 1 nm, varying only slightly with change of line width as shown in the bottom frames. In other words, since the dose is controlled in a MBW to better than 1%, the change of edge position with 1% change of dose is within approx. one atomic layer.

Figure 13A:
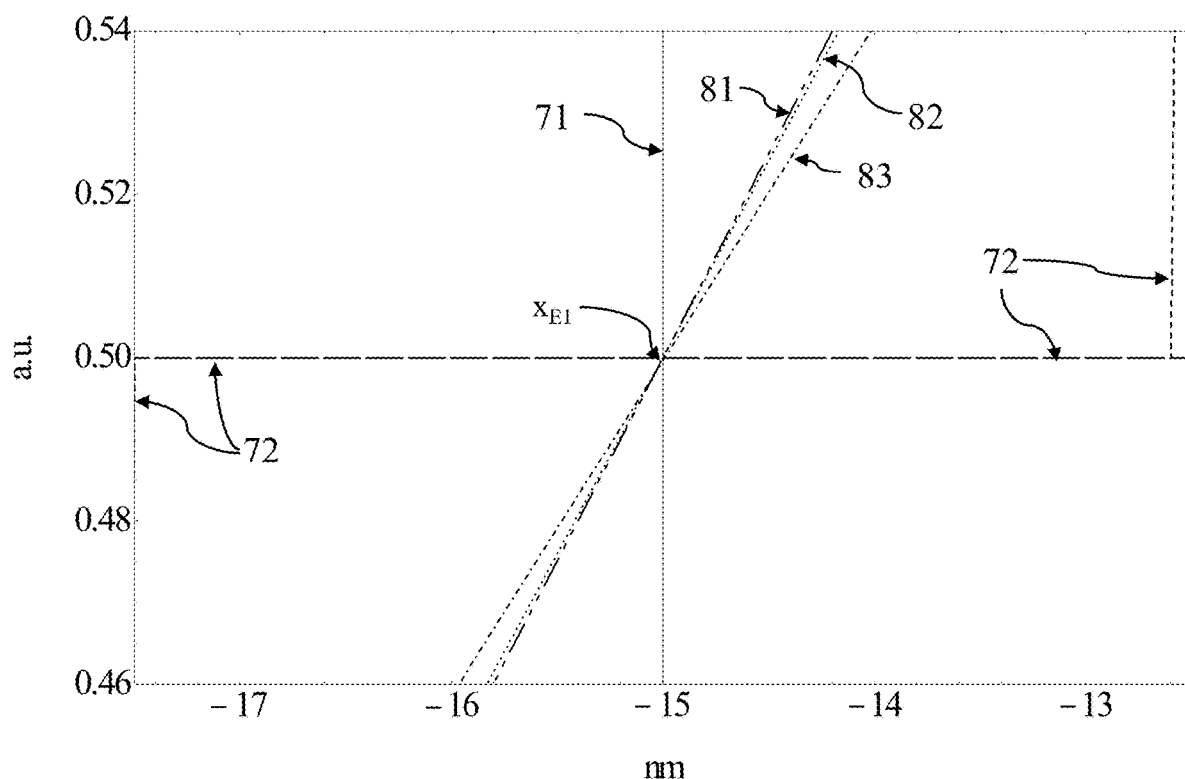
FIG. 13A shows a detail of FIG. 13 at the left-hand flank where the intensity profiles crosses the "0.5" intensity level.

FIG. 13 illustrates a most important advantage of the MBW, namely, that the line width is virtually independent of blur at the 50% dose threshold. Shown in FIG. 13 are the intensity profile 71 for zero blur, the dose level histogram 72, and resulting intensity profiles 81, 82, 83 calculated with 3.5 nm, 5.0 nm, and 7.5 nm 1 sigma blur, respectively. The edge positions $x_{E1}$ and $x_{E2}$ of the generated structure are where the zero blur intensity profile 71 crosses the "0.5" intensity level ("dose-to-clear"). The enlarged detail of FIG. 13A shows the region around the position $x_{E1}$ at the left-side flank. The dose level assignments 72 are for using 20 nm beam size with 1 sigma blur of 5 nm and Quad Grid multi-beam exposure, providing a 5 nm physical grid size.

FIGS. 14A, 14B, and 14C show intensity profile diagrams illustrating how the multi-beam exposure methods illustrated here can achieve a fine positioning of structure feature with resolution smaller than the grid size. In the intensity profile diagrams, like those of FIGS. 14A-C, the discrete dose levels are visualized as rectangles 64 of uniform height, piled up in a "brick-layer" arrangement; of course, this "brick-layer" depiction is only symbolical and intended to facilitate interpretation of the drawings.

FIG. 14A shows a dose level histogram, for the example of a line of 30 nm width exposed by means of a 4 bit (i.e., 15 dose levels per spot) exposure in a Quad Grid with a beam spot size of 20 nm width. The grid size 62 is ¼ of the linear size of the exposure spots, which are symbolized as rectangles piled up in a "brick-layer" arrangement, and the resulting dose level distribution 65 is outlined as a bold line.

The line width can be made smaller or larger in very fine steps, which are smaller than the grid size, in this case the Quad Grid size 62. Reducing the line width can be achieved by lowering the dose level of the outermost exposure spots and/or omitting exposure spots (the latter when the reduction is at least about one half of an exposure spot size). Increasing the line width can be achieved by enhancing the dose level of the outermost exposure spots and/or, in particular when the maximum dose level has been reached, by adding an additional, preferably overlapping, exposure spot. The latter aspect is illustrated in FIG. 14B: an exposure spot 66 having a defined dose level is added, resulting in a dose level histogram 67 for the line with larger width compared to 65. By combining these effects of decreasing and increasing on either side, there is also the possibility to shift the line position in very fine steps. FIG. 14C illustrates a shift of the line without changing the width, which is achieved by removing dose levels from spot 68 and adding dose levels from spot 69, resulting in the dose level histogram 70 which corresponds to a line shifted to the right as compared to the line of FIG. 14A.

The intensity profiles of FIGS. 14A-C are shown along the X direction of the target plane. It is straightforward to extend the multi-beam exposure methods illustrated here to lines along other directions as well, and fine positioning can be achieved for lines at any angle on the target plane.

Under realistic circumstances there are deviations of the local exposure dose with respect to the targeted exposure dose within the BAF. Furthermore a slight variation of beam blur over the exposure field is to be expected. This is illustrated in FIGS. 15A and 15B.

Figure 15A:
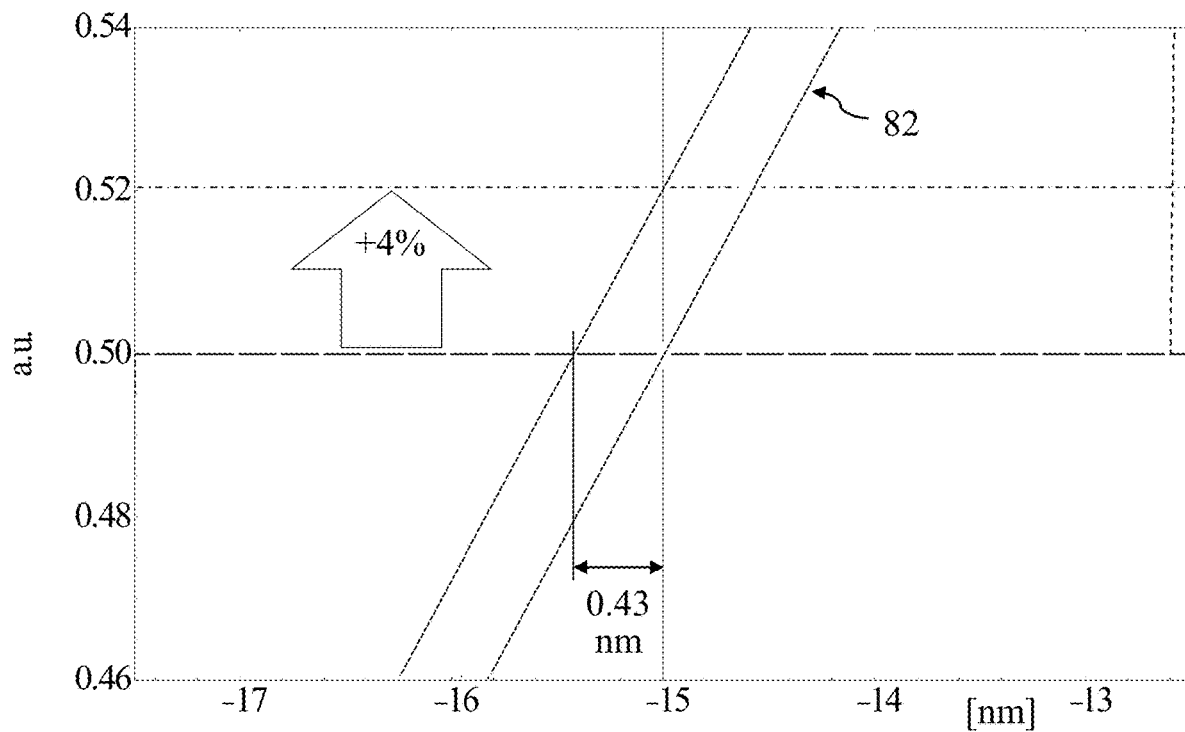
FIGS. 15A,B show detail views like that of FIG. 13A, where

FIG. 15A shows an exemplary case where, starting from the case of 5 nm 1 sigma beam blur with intensity profile 82 of FIG. 13, the exposure close deviates from the nominal dose level by +4%. As can be seen, the line edge at 0.5 intensity level is shifted by 0.43 nm. This means that in this example, instead of a CD of 30.0 nm, a line with having a width of 30.0 nm+2*0.43 nm=30.86 nm will be printed as a result of the dose level increment of 4%.

Figure 15B:
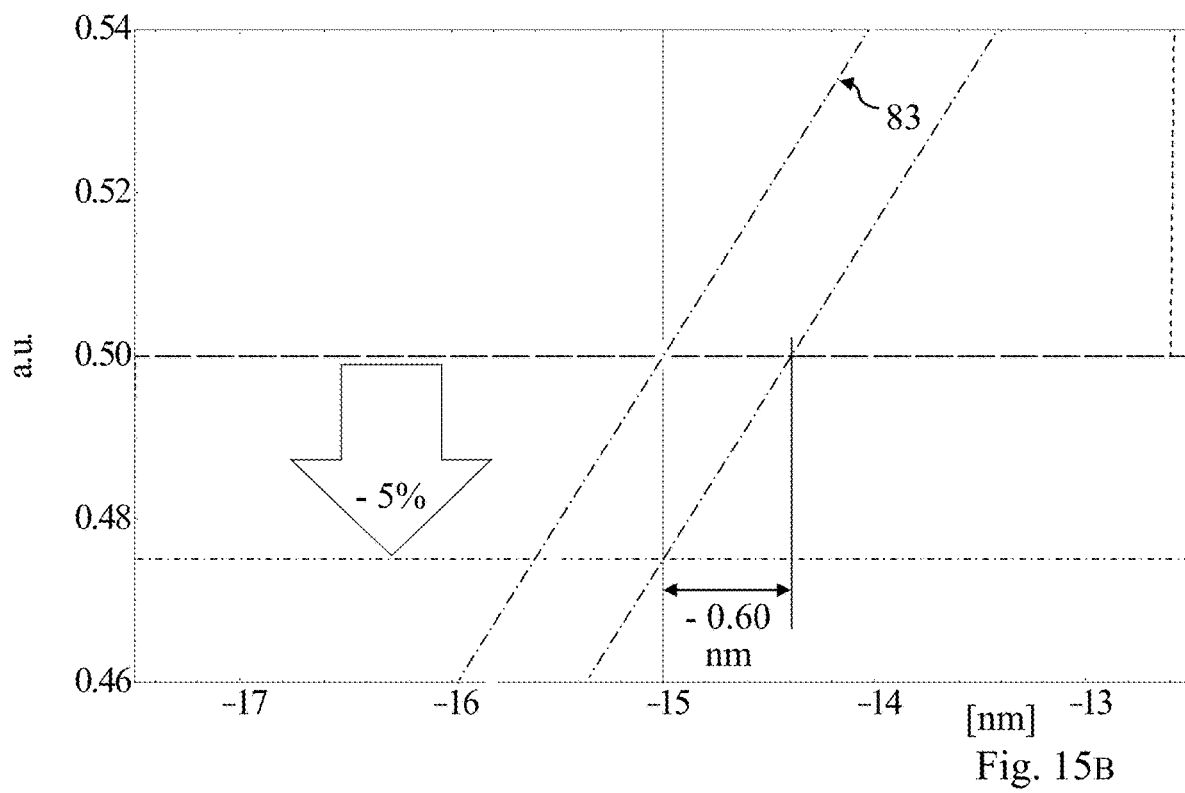
FIG. 15B illustrates the effect of decreasing the intensity distribution by 5%, causing a line edge shift of 0.48 nm.

As illustrated in FIG. 15B, starting from the local beam intensity profile 83 of FIG. 13 with 1 sigma blur of 7.5 nm, a dose error causing a dose level decrement of −5% will shift the edge position by −0.60 nm, so instead of a CD of 30.0 nm, a line with 28.8 nm width would be printed.

Figure 16:
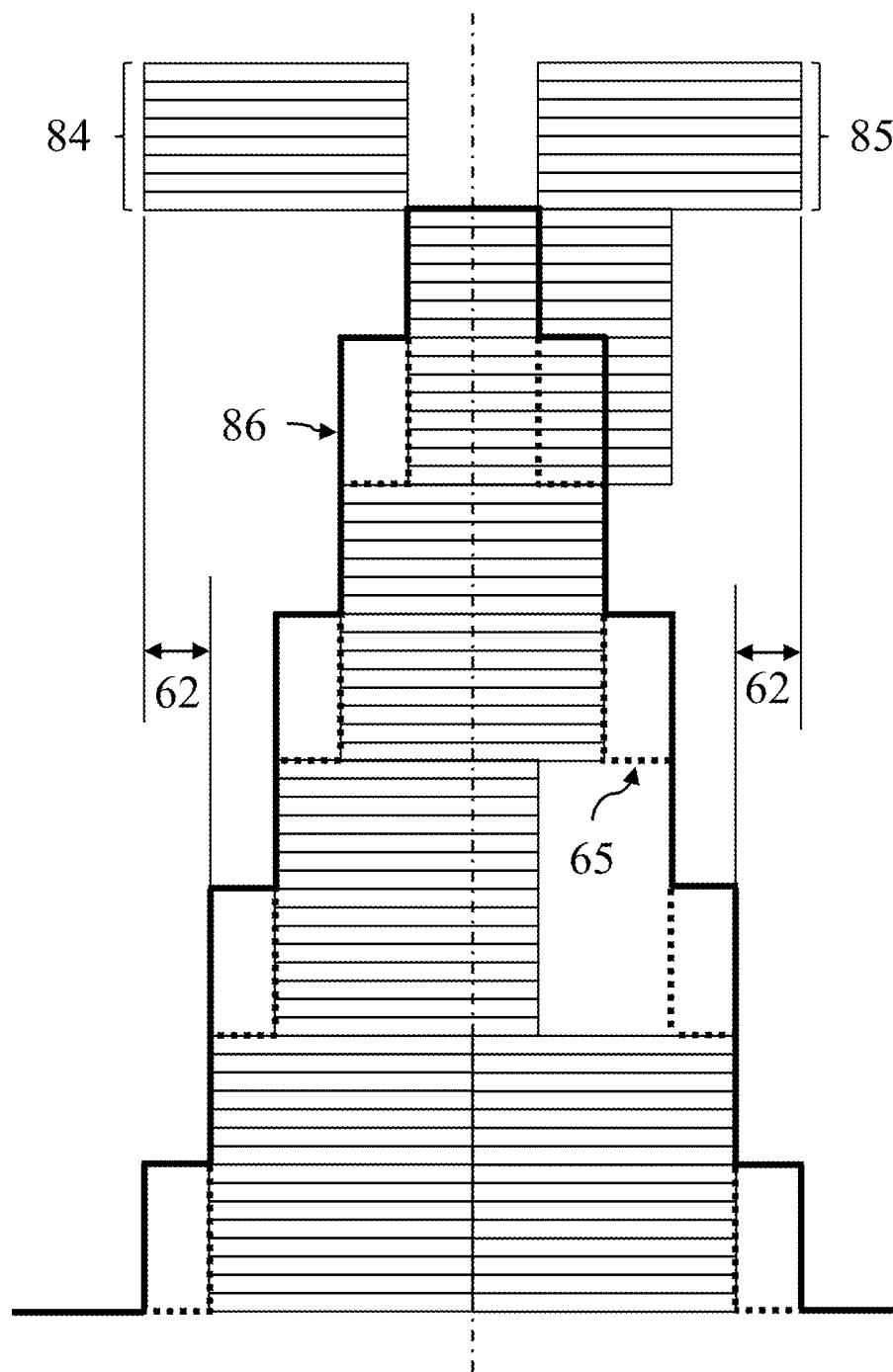
FIG. 16 illustrates the widening of a single line feature by applying a kernel according to the invention.

A correction of the position of edge features is possible by suitable adding of exposure dose near the edge to be shifted. For instance, FIG. 16 shows a dose level histogram 86 as an example for widening a line. Starting from the 30 nm line of FIG. 14A (dotted line 65 in FIG. 16) both edges are shifted by an amount of one physical grid size 62 by adding overlapping exposure spots 84 and 85 at the position of the edge, resulting in the dose level histogram 86.

Figure 17:
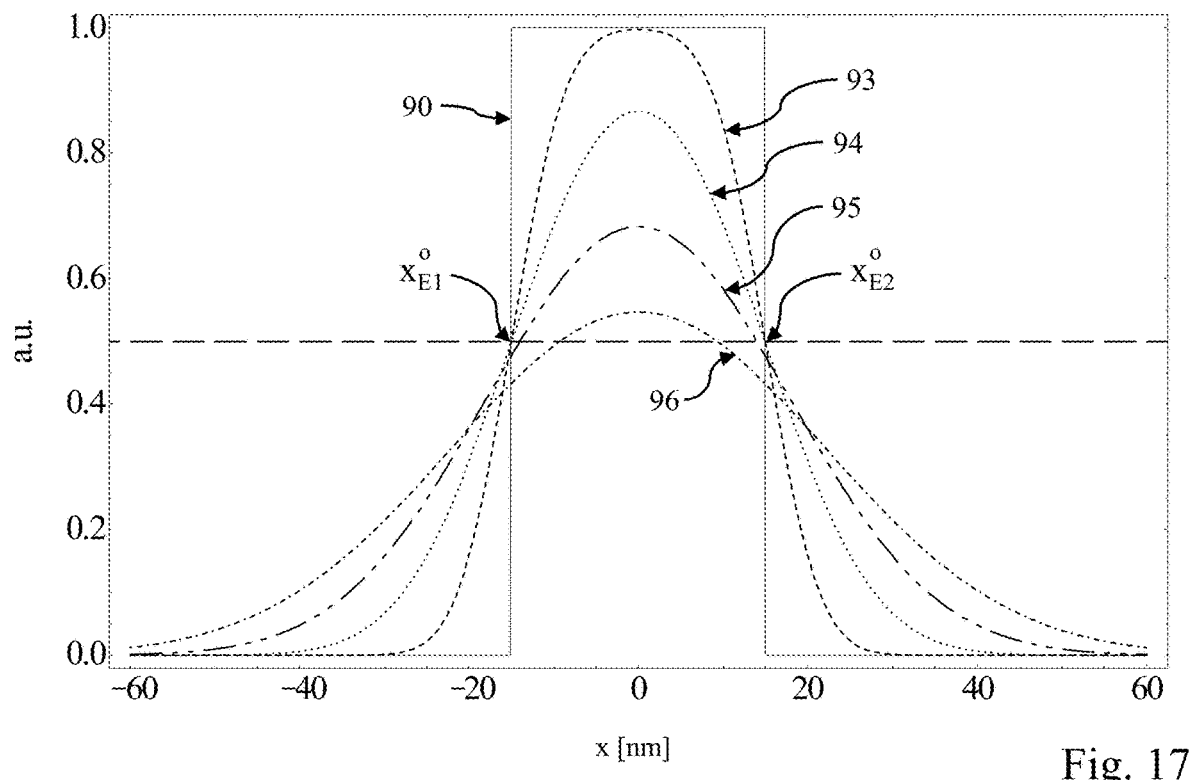
FIG. 17 illustrates intensity profiles in a MBW at different blur.
Figure 17A:
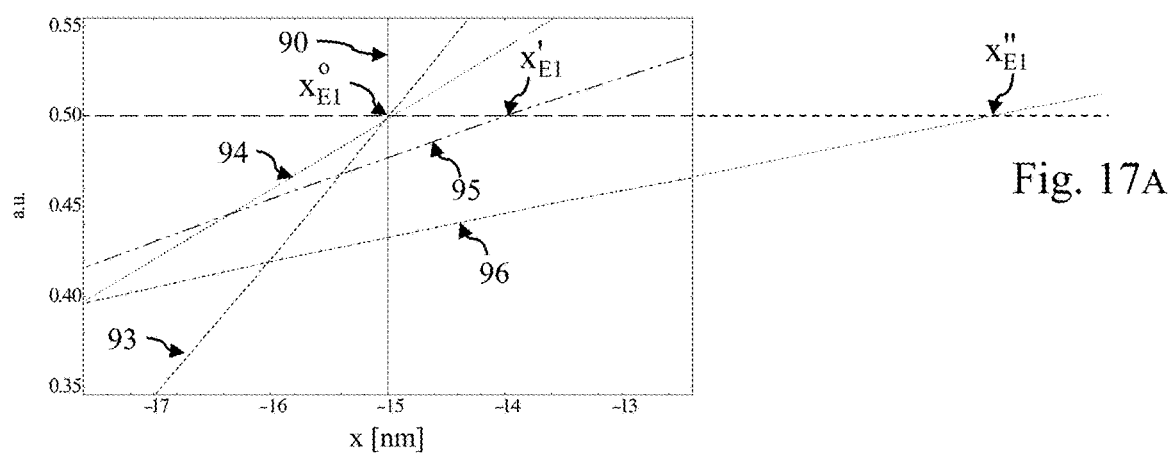
FIG. 17A shows a detail of FIG. 17 at the left-hand flank where the intensity profiles crosses the "0.5" intensity level.

FIG. 17 illustrates how the intensity distribution is degraded with increased blur, and the possible effect on the resulting edge position. Neglecting blur ("zero blur"), the ideal intensity profile 90 is shown for a line with 30 nm line width. The "0.5" level of the intensity profile corresponds to the "dose to clear" separating regions with and without resist development from each other. Since the "0.5" level defines the edge of the line to be written, the effect of the blur may cause different dose latitudes and thus deviations of the edge position as written from the nominal desired positions. The desired positions $x°_{E1}$ and $x°_{E2}$ of the left-hand edge and right-hand edge, respectively, are met for the zero-blur intensity profile 90. For a 5 nm 1 sigma blur the intensity profile 93 can still fulfill this condition to a large extent; but the intensity profiles 94, 95, and 96, which correspond to 10 nm, 15 nm, and 20 nm 1 sigma blur, respectively, are increasingly deviating. In particular, as can be seen from the enlarged detail of FIG. 17A, the positions of the intensity-profile (i.e., "0.5"-level intersections) are shifted off desired edge positions $x°_{E1}$ and $x°_{E2}$ (left-hand and right-hand edge, respectively) to degraded edge positions $x'_{E1}$ and $x''_{E1}$, respectively, with the intensity profiles for a 1 sigma blur of 15 nm and 20 nm.

Figure 32A:
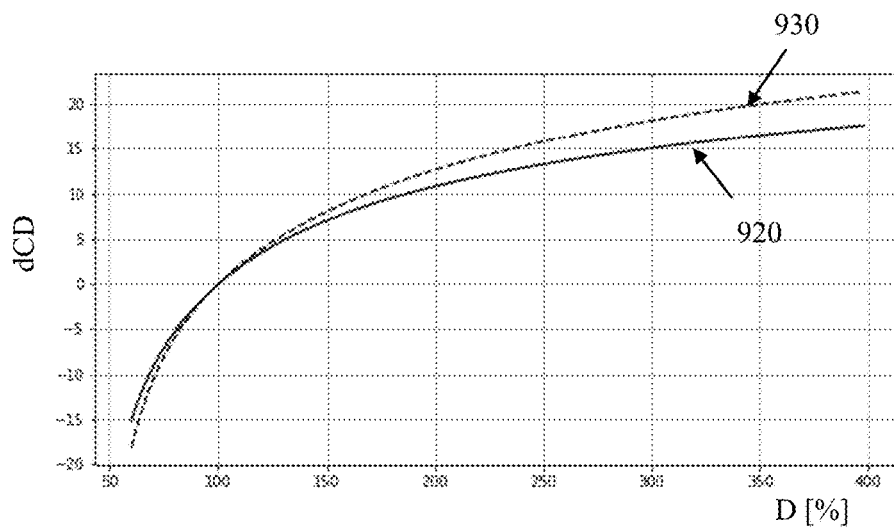
Figure 32B:
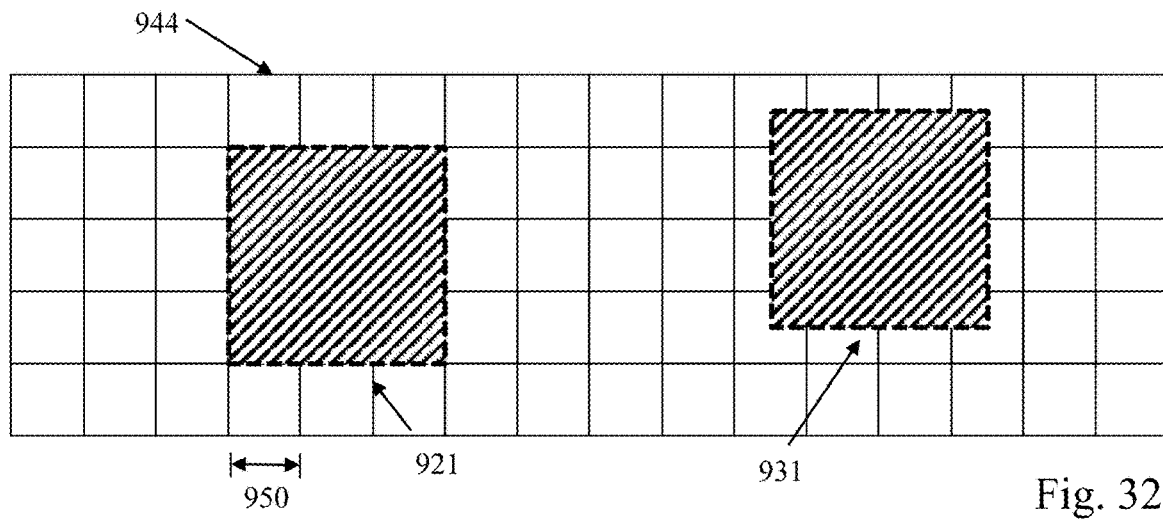
Figure 32C:
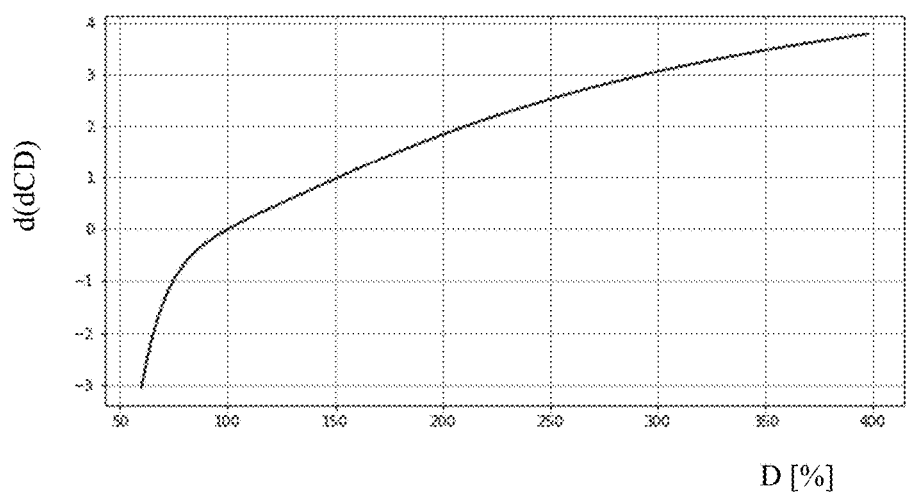

FIG. 32A shows the change dCD of the critical dimension 920 of a feature whose edges coincide with the physical grid and of the critical dimension 930 of a feature whose edges lie in the middle between two physical grid points, as functions of the local exposure dose D used in the feature, both for the case of the "Double Grid" multi-beam exposure mode and a 5 nm 1 sigma blur. For better clarity the corresponding features 921, 931 are depicted in FIG. 32B (note that both features are of same size), where the physical grid 944 of the Double Grid mode is indicated (also cf. FIGS. 6A and 8A). Note that the edges of the feature 921 coincide with the physical grid, which under dose variation scales according to the line 920 of FIG. 32A; whereas the edges of the feature 931 are relatively offset by half the pitch 950, which for instance for beamlet size of 20 nm and o=2 is 10 nm, and thus the offset of 931 relative to the physical grid is 10 nm/2=5 nm. For simplicity the same offset in both directions X,Y is assumed in this example. The difference d(dCD) between the change of critical dimension dCD by changing the dose of both features is plotted in FIG. 32C, which shows that the resulting difference in feature size d(dCD) depending on the location relative to the grid is only zero for the isofocal dose D1, which in FIGS. 32A+C correspond to the absolute dose value 100%. Consequently, under- or overdosing can, in combination with the overlapping pixels write mode, lead to a degradation of the CD uniformity since features may scale differently depending on their placement relative to the physical grid. As can also be seen, this CD error scales monotonically with the amount of deviation from the isofocal dose.

Data Path

Figure 18:
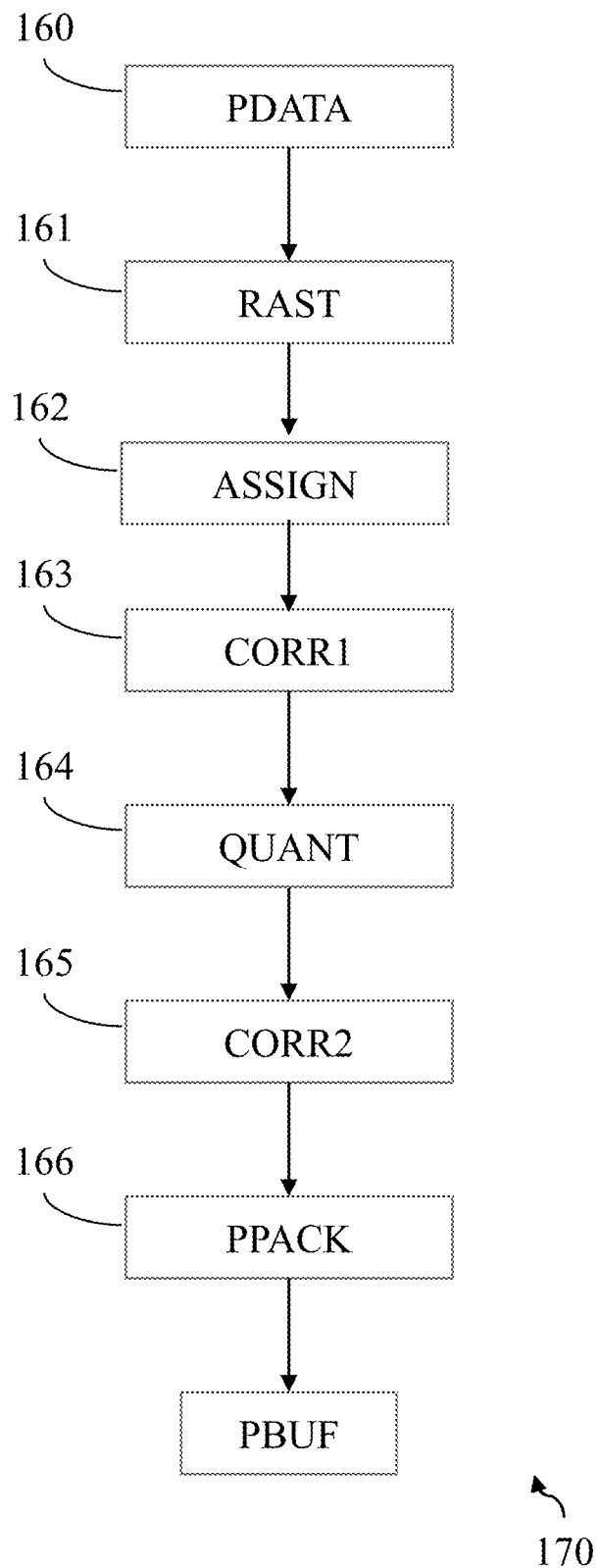
FIG. 18 a flow diagram illustrating the "data path" of the data preparation for a pattern.

The part of the processing system 18 of the writer tool (FIG. 1) that converts the patterns to be written to beamlet dose assignments (as described above), which can be used in the writing process, is referred to as "data path" system. FIG. 18 shows a flowchart of the data path 170 in the context of the invention. The data path is preferably performed in real time; in a variant, part or all of the calculations of the data path may be performed in advance, for instance in a suitable computer.

The complete pattern image comprises a vast amount of image data, which is why for efficient computation of those data a high-speed data path that generates the pixel data to be exposed, preferably in real-time, will be suitable. The pattern to be exposed is typically described in a vector format, e.g. as a collection of geometries like rectangles, trapezoids or general polygons, which typically offers better data compaction and therefore reduces the requirements on data storage. The data path therefore consists of three major parts:

a vector-based physical correction process (step 160),
rasterization processes to translate the vector to pixel data (steps 161 to 164), and
buffering of pixel data for temporary storage for the writing process (steps 165 and 166).

The data path starts upon being supplied a pattern PDATA to be exposed at step 160. In step 160, generally, the pattern PDATA to be exposed is split into a large number of small data chunks, possibly with geometric overlaps. Corrections that can be applied in the vector domain (e.g. proximity effect correction) may be carried out to all chunks independently, possibly in parallel, and the resulting data is sorted and coded in a way to improve computation speed of the following steps. The output is a collection of chunks where all chunks contain a collection of geometries.

Stage 161: Rasterization RAST. The geometries of every chunk are converted into rasterized pixel graphics. In this step, each pixel is assigned a floating-point gray scale intensity depending on the geometric overlap of the corresponding surface of the raster-grid cell with the pattern to be exposed, i.e. the entity of all associated chunks. In stat-of-the-art solutions THIS floating-point intensity represents the ideal physical exposure dose to be delivered onto the target at the respective pixel location. In more detail, every pixel that is completely inside a geometry is assigned the maximal intensity, whereas the intensity of pixels that crosses an edge of a geometry is weighted by the fraction of the area of the pixel that is covered by the geometry. This method implies a linear relation between the area of the geometry and the total dose after the rasterization.

Stage 162: Pixel-to-beamlet assignment ASSIGN. In this step, given a particular write sequence, it is determined which pixel will be written by which beamlet.

Stage 163: Pixel based corrections CORR1. In this step, all corrections that can be applied in the pixel domain are performed. These corrections comprise compensation of deviations from a uniform current density of the beam 50 over the aperture field (as described above and in U.S. Pat. No. 9,495,499 of the applicant) and/or correction for individual defective beam deflectors in the DAP 30 (as in US 2015/0248993 A1). Pixel based corrections are realized by modifying the floating-point intensity of each individual pixel. This is being done with respect to the Pixel-to-beamlet assignment of Stage 162, which makes it possible to define and apply a compensation dose-factor q (or, equivalently a dose-shift s) for each pixel depending on by which beamlet it is written, and/or by which beamlets the neighboring pixels are written.

Stage 164: Quantization QUANT. The quantization process converts the possibly corrected, floating-point intensity of each pixel into a quantized (or equivalently 'discrete') gray level, given a predetermined gray value scale.

Stage 165: Further optional pixel based corrections CORR2 in the gray-level pixel data domain may be applied (not part of the present invention).

Stage 166: Pixel packaging, PPACK. The pixel image obtained from stage 164 is sorted according to the placement grid sequence and sent to a pixel buffer PBUF which is provided in the processing system 18 of the writer tool (FIG. 1). The pixel data is buffered until a sufficient amount of data, typically at least the length of a stripe, is present, which triggers the exposure of the stripe (see FIG. 7). The data is taken out of the buffer during the writing process. After the stripe has been written, the process described above starts anew for the pattern data of the next portion of the exposure region, such as the next stripe.

Dose-Guided Reshaping

The present invention pertains to a recalculation method for pattern data, which realizes a dose-related feature reshaping and involves a transformation of dose assignments in pattern data, in particular pattern vector data, into pattern size adjustments.

Figure 19:
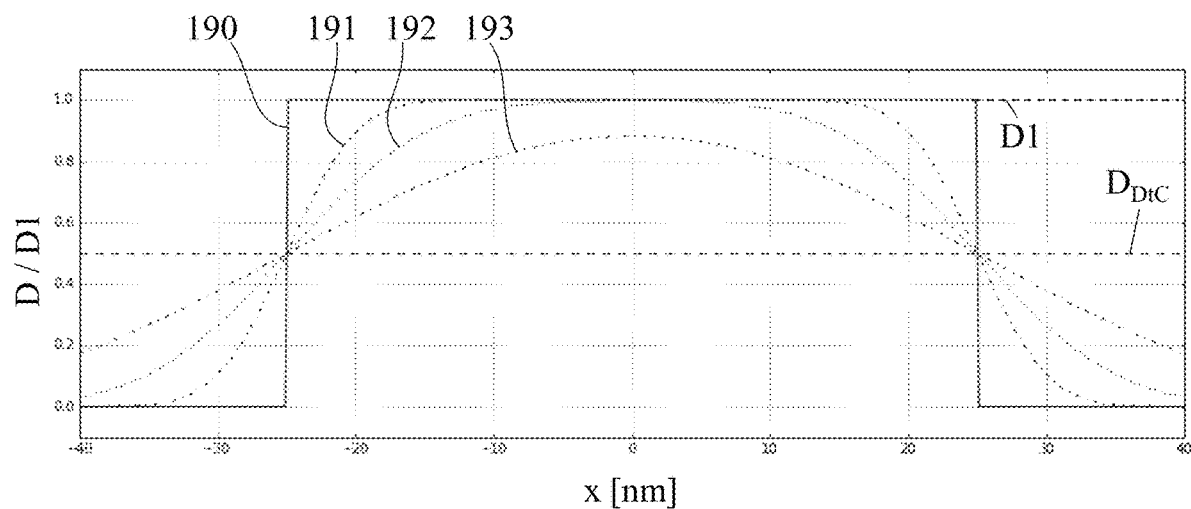
FIG. 19 shows various dose profiles at different blurs for illustrating the isofocal dose.

FIG. 19 explains the concept of isofocal dose. Evidently, for an arbitrary pattern, the generated dose profile will, in general, depend on the blur of the beam used for exposure. For instance, a 50 nm line with ideal dose profile 190 is exposed, and FIG. 19 shows the emerging profiles for beam blurs with standard deviations of 4 nm (191), 8 nm (192) and 16 nm (193). If the assigned dose D1 for the ideal profile 190 (the values of the exposure dose D are normalized to D1 in the drawing) is chosen to be twice the dose-to-clear of the resist, i.e. $D1=2*D_{DrC}$, the exposed width is normally independent of the beam blur—and therefore "isofocal", i.e., invariant with focal changes of the optical imaging system. Hence the name "isofocal dose". It should be noted that for feature sizes in the order of the beam blur, such behavior is generally only possible for certain patterns (e.g. lines and spaces of equal width). In such a situation, it may be suitable to use a different dose in order to obtain an optimal process window. However, the invention can also be used (e.g. for increased throughput) with a nominal dose below the isofocal dose.

Figure 20:
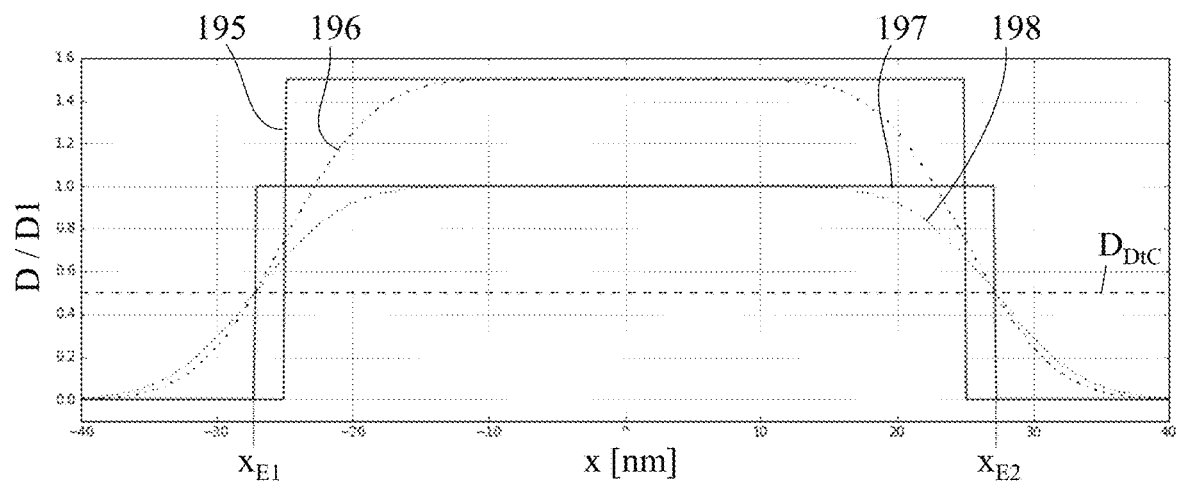
FIG. 20 shows a comparison of dose profiles for illustrating the basic principle of the reshaping according to the invention.

FIG. 20 illustrates the basic principle for manipulating feature sizes involving overdose. In the example shown, by prescription, a 50 nm line with ideal dose profile 195 has an assigned dose which is overdosed by 50% relative to the isofocal dose D1 (normalized to 1). At 5.1 nm sigma blur (i.e. 12 nm FWHM), this results in an emerging profile 196 with edges at positions $x_{E1}$ and $x_{E2}$, realizing a feature size $x_{E2}-x_{E1}=54.4$ nm, assuming that the dose-to-clear $D_{DrC}$ is at the level 0.5 (indicated by a dashed line). When restricting the dose of this pattern element so as be no more than 1 (or more generally, the isofocal dose D1), it will be necessary to also adapt the nominal feature size from originally 50 nm to 54.4 nm by a reshaping operation, in order to maintain the width of the emerging profile. This corresponds to the dose profile 197 and the resulting dose profile 198.

Figure 21:
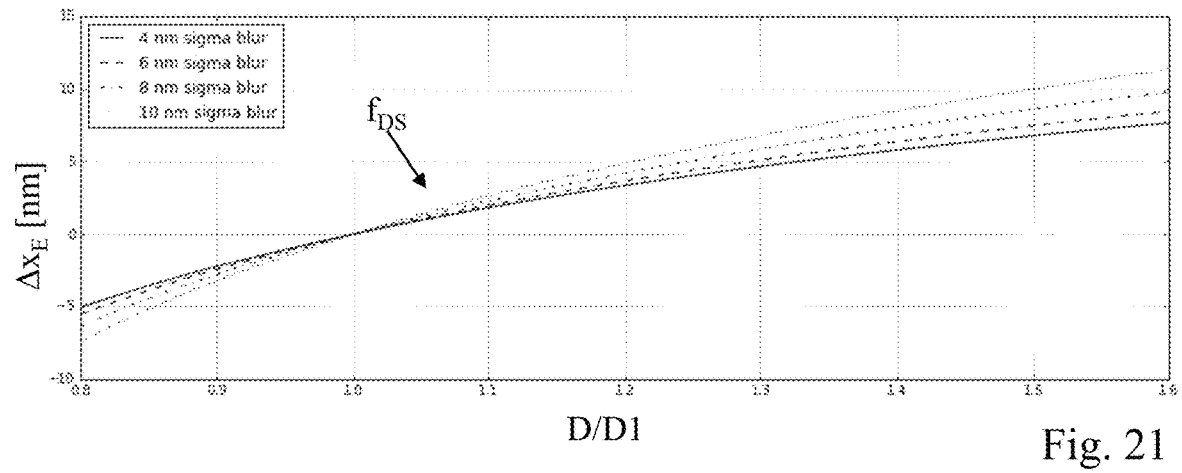
FIG. 21 illustrates an example of a "dose slope function", which describes the change in feature size as function of relative dose (i.e., the change of the dose of a pattern element relative to the nominal dose), with the blur as additional parameter.

FIG. 21 shows the dose slope function $f_{DS}$, describing the change of edge position, $\Delta x_E$, of a line feature as function of the dose factor, relative to the value of the isofocal dose, for an implementation as used in FIGS. 19 and 20 at different values of blur as a parameter as indicated in the window insert. The dose slope function indicates how blur and assigned dose D (relative to the isofocal dose, i.e. as D/D1) are related to change of edge position, and thus, feature size. Such a chart is easily obtained experimentally or from simulations, and it can be used to translate dose manipulations into feature size manipulations and vice versa. If only a small dose or blur window is utilized, linearizations are generally sufficient (e.g. using a scalar dose slope).

Figure 22:
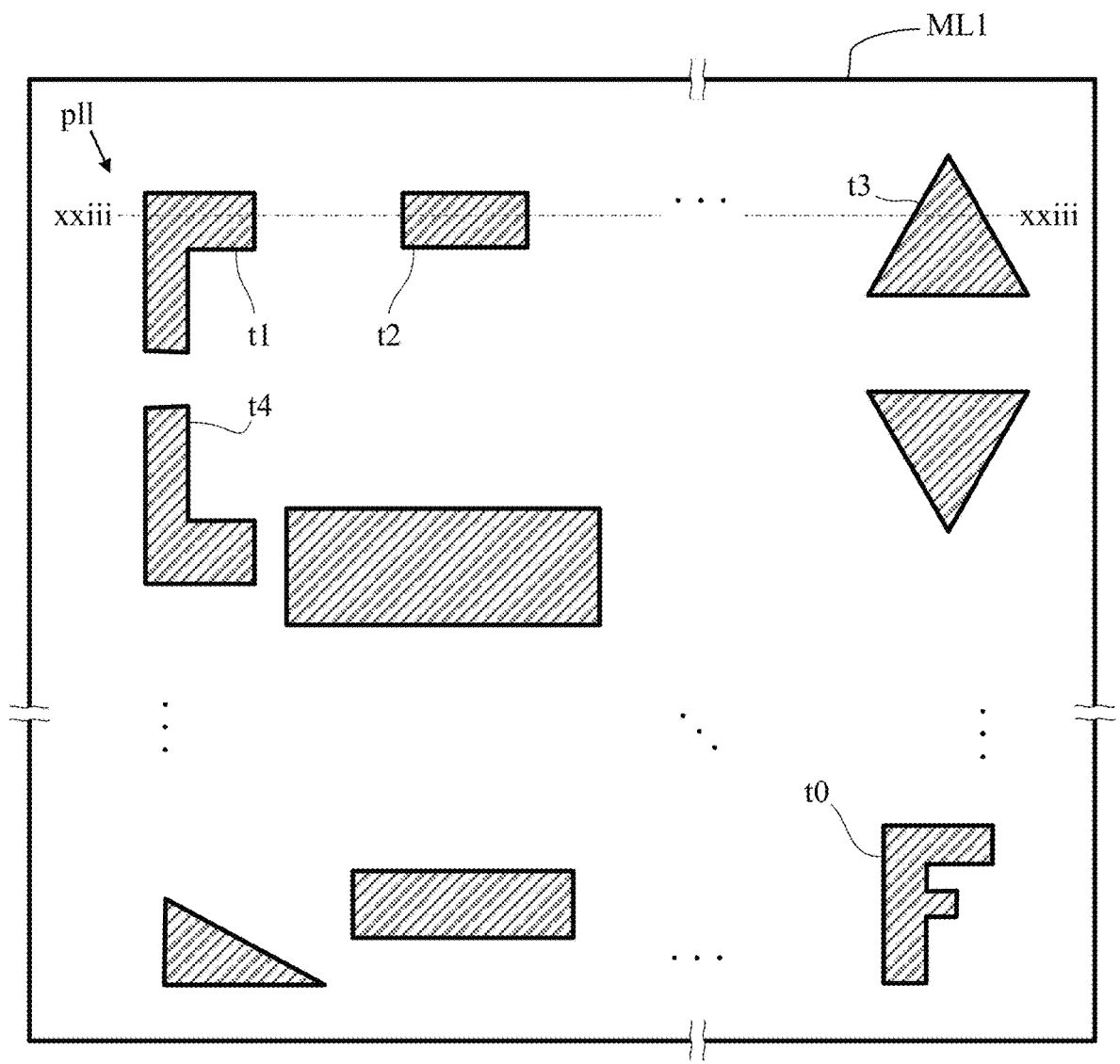
FIG. 22 depicts an example of a pattern layout defined by means of a number of polygons.

FIG. 22 shows a simplified example of a pattern layout p11, which is defined in a region of exposure ML1 on the target. Several pattern elements are defined, for instance as polygonal shapes t1, t2, . . . t3, t4, . . . t0. Each of the pattern elements is associated with a defined assigned exposure dose.

Figure 23A:
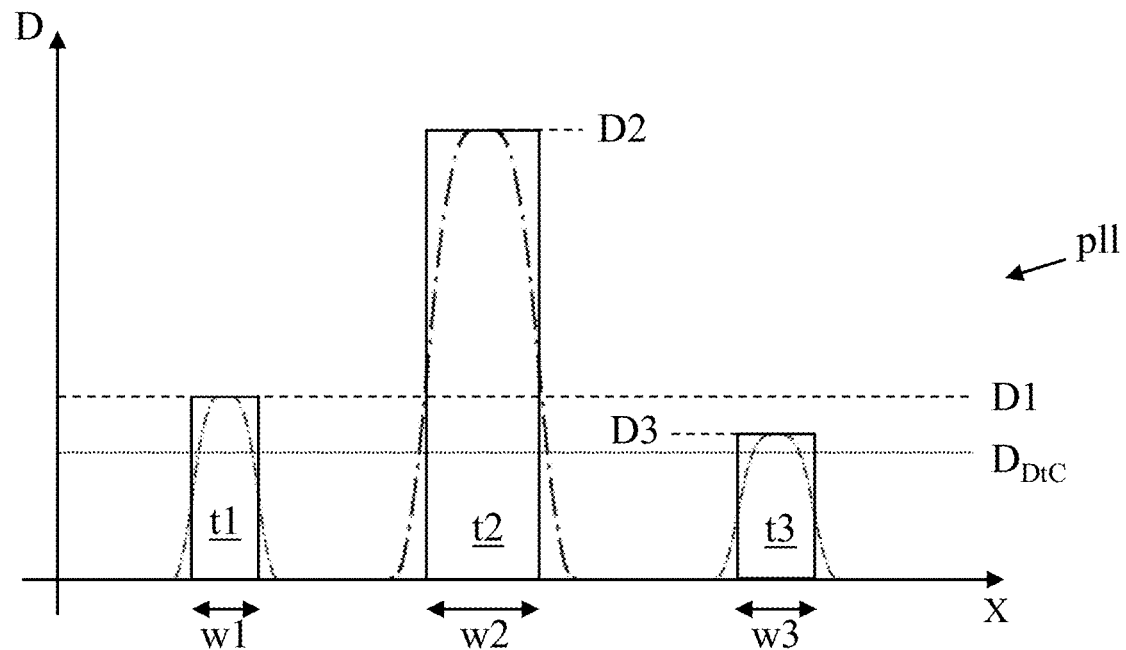
FIGS. 23A+B illustrate the reshaping method according to the invention, where
Figure 23B:
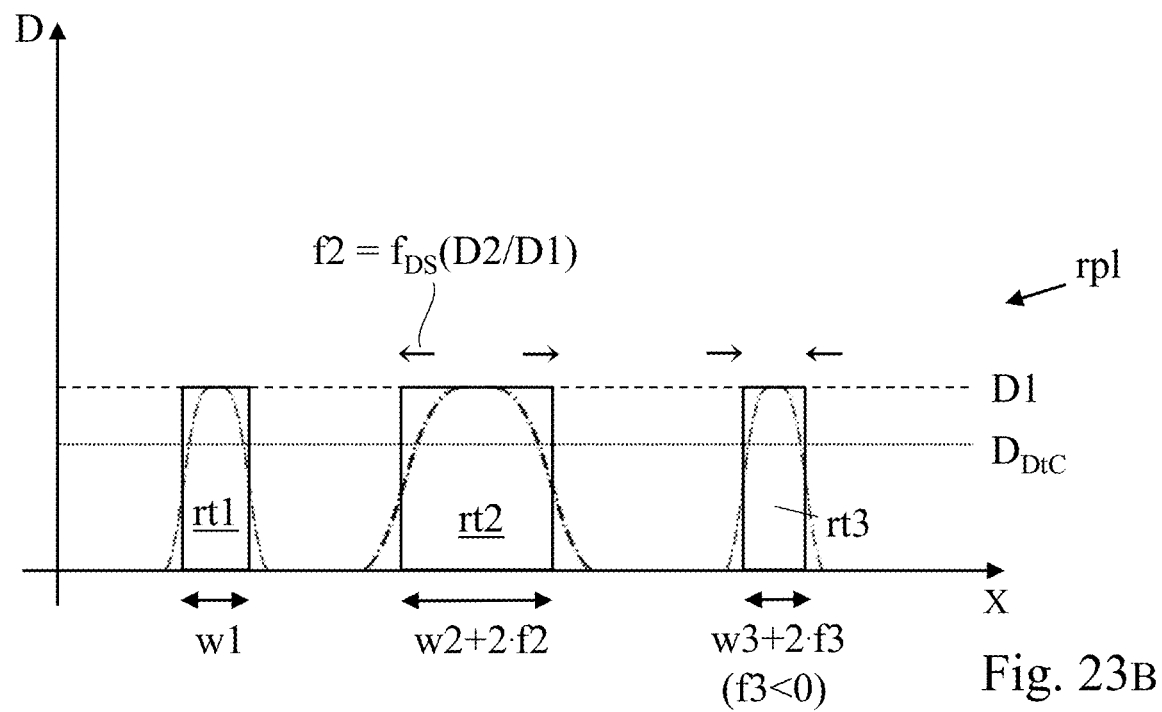
FIG. 23B shows a dose profile of the pattern elements after reshaping

The principle of the reshaping method according to the invention is illustrated in FIGS. 23A+B with the example of the pattern elements t1, t2, t3 of FIG. 22; FIG. 23A,B show dose profiles, i.e. the local exposure dose D as a function of the coordinate X, taken along the line xxiii-xxiii of FIG. 22, before and after the reshaping, respectively. FIGS. 23A,B show the ideal dose profiles as solid lines, whereas the emerging dose profiles are shown as dash-dotted lines. As can be seen in FIG. 23A the three pattern elements t1, t2, t3 of the initial pattern layout have widths w1, w2, w3, respectively (cross-sectional width along the line xxiii-xxiii), and have different values D1, D2, D3 of assigned exposure dose, respectively. In particular, pattern element t1 has an assigned dose which coincides with a nominal dose D1, whereas the assigned doses D2, D3 of the other two pattern elements t2, t3, are higher and lower, respectively, than the nominal dose D1. Each of the assigned doses D1, D2, D3 is above the value of the dose-to-clear $D_{DrC}$. The reshaping according to the invention aims at modifying the pattern elements such that the exposure doses assigned to them are modified to values corresponding to the nominal dose D1, while not affecting the width of the features in the exposed pattern; for this the widths of the ideal profiles will have to be adapted in a suitable way. FIG. 23B shows a reshaped profile where each of the pattern element is replaced by a reshaped pattern element rt1, rt2, rt3, which are assigned the nominal dose D1. The widths w1, w2, w3 of the pattern elements are corrected in accordance with the dose slope function $f_{DS}$ (see FIG. 22)). For the first pattern element t1, no adaptation is necessary since its initial assigned dose already is equal to the nominal dose D1. The second pattern element t2 has initially assigned dose D2, which corresponds to a dose slope value $f2=f_{DS}(D2/D1)$. Therefore, the width of the reshaped pattern element rt2 is changed to w2+2·f2. Note that the adapted width rt2 is chosen in such a way that the emerging dose profile (dash-dotted curves) has the same width as the original, over-dosed pattern element t2. Similarly, the width of the third reshaped pattern element rt3 is changed to w3+2·f3, where f3 is negative since D3<D1 and, therefore, $f_{DS}(D3/D1)<0$. (The calculation of f3 also involves a geometrical correction for the inclination of the edges of feature t3—see FIG. 22—which involves an additional factor $1/\sin\alpha$, where $\alpha$ is the angle to the coordinate line X; thus, $f3=f_{DS}(D3/D1)/\sin(\pi/3)$, where $\pi/3$ is an angle of 60°. For the elements t1, t2, the lines are at a right angle to the X direction and the geometrical correction factor is 1. This is a consequence of the fact that the widths in FIG. 23b are cross-sectional widths taken along a specific direction X.) The reshaped pattern elements rt1-rt3 are then substituted for the initial pattern elements t1-t3, thus forming a reshaped pattern rp1.

In the example of FIG. 23A,B, the nominal dose D1 has an arbitrary value above the dose-to-clear $D_{DrC}$, which represents a general case. A suitable choice of the nominal dose D1 is, as mentioned above, the double of the dose-to-clear $D_{DrC}$, i.e., $D1=2\cdot D_{DrC}$.

The method according to the invention may be realized in the vector domain or pixel domain. In the data path shown in FIG. 18, a vector-based reshaping can be performed during the PDATA stage 160, whereas if a reshaping is done in the pixel domain, a suitable implementation is during the CORR1 stage 165 prior to dose quantization. Depending on the application, only one or both correction stages may be necessary.

Re-Shaping in the Vector Domain

The reshaping method can be performed in the vector domain, where the pattern elements are defined as geometrical shapes, e.g. polygons which include a number of edges. In particular, referring again to FIG. 22, the polygons t1, t2, . . . t3, t4, . . . t0 of pattern layout p11 are defined as two-dimensional closed polygons. The polygons are usually convex, but also concave shapes may occur. Reshaping corresponds to a parallel shifting of the edges inwards or outwards under the constraint that the resulting objects are closed shapes (polygons) again. Here, "parallel shifting" means that the edges are displaced while maintaining their orientation, while the amount of shifting is measured along a direction perpendicular to the orientation of the respective edge.

From a geometrical point of view, the common practice of fine-tuning the feature-size by changing the dose setting corresponds to a geometric operation called (polygon) "offsetting"; another common term for this operation is "wavefront propagation", as described e.g. in the PhD thesis of Stefan Huber "Computing Straight Skeletons and Motorcycle Graphs: Theory and Practice", Univ. of Salzburg (Austria) June 2011, pp. 3-19. Polygon offsetting only involves local operations of growing/expanding (or shrinking/contracting) which are applied to the edges and vertices of the object (in contrast to a scaling operation applied to the entire polygon, which is a global multiplicative operation), and will in general also alter the aspect ratio of the geometric shape, in particular of rectangular shapes.

In this respect the following two algorithms are considered for implementation with MBW writers. The algorithms are explained in the following based on an exemplary F-shaped polygon. The start shape is shown in FIGS. 24-27 as polygon t0 of FIG. 22 ("start polygon"), which is defined by several straight edges, t01, t12, . . . (shown as straight dark lines) which respectively link subsequent two of the vertices tv1, tv2, . . . of the start polygon t0.

Figure 24:
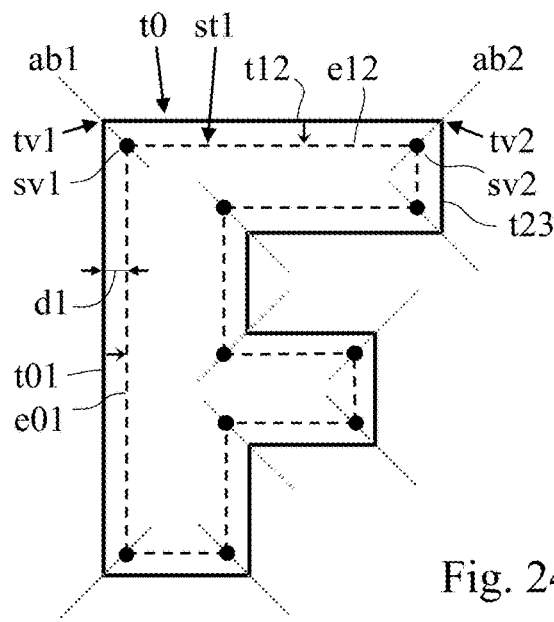
FIG. 24 illustrates a contracting reshaping of a pattern element according to a first aspect of the invention.
Figure 25:
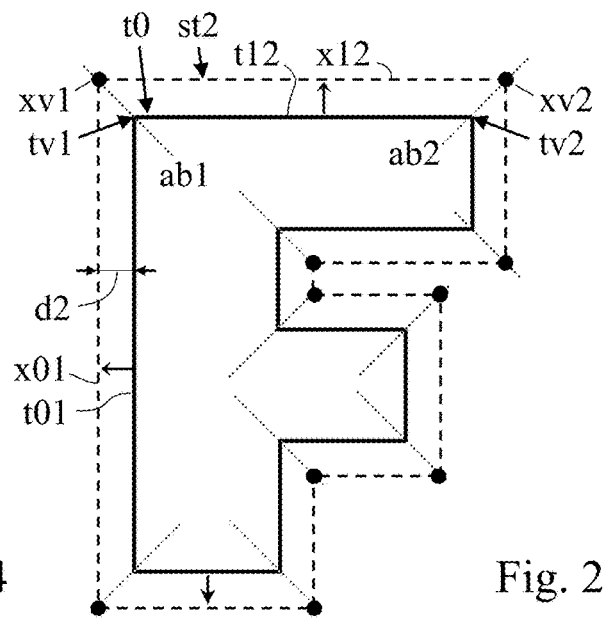
FIG. 25 illustrates an expanding reshaping of a pattern element according to the first aspect.

In a first preferred embodiment, illustrated in FIGS. 24 and 25, reshaping of a polygon is done by a generalized offsetting method. FIG. 24 shows the case of contracting the polygon t0 by a reshape distance d1. For each vertex tv1, tv2 of the polygon, there are two edges incident at the vertex, and the angular bisector ab1, ab2 of these two edges is determined (for example, for vertex tv1, angular bisector ab1 is determined from edges t01 and t12; for vertex tv2, angular bisector ab2 is determined from edges t12 and t23, and so on). The angular bisectors ab1, ab2, . . . are indicated as dotted lines. For each vertex tv1, tv2, . . . , the position of the vertex is shifted along the respective angular bisector ab1, ab2, . . . , such that the shifted vertex sv1, sv2, . . . is at a distance to the respective original edges t01, t12, 23, . . . , which distance corresponds to the reshape distance d1. In this case, the vertices are shifted inwards, as required for a contracting reshaping of the polygon. Thus, shifted vertices sv1, sv2, . . . are obtained, which are shown as circular dots. The shifted vertices are linked by straight lines which define the shifted edges e01, e12, . . . of the resulting polygon st1, indicated by dashed lines in the figure. All shifted edges e01, e12 of the resulting polygon st1 are at the same reshape distance d1 to the corresponding original edges t01, t12; this is evident since the assigned dose is an attribute of a polygon shape, and thus the assigned dose and the reshape distance d1 calculated therefrom is uniform for all edges of a shape. Specifically, the reshape distance d1 is determined from the value of the assigned dose of the polygon t0, using the predefined dose slope function $f_{SD}$ (see FIG. 21) with regard to the nominal dose; this case, which corresponds to contracting the polygon t0, the latter has an assigned dose which is below the nominal dose, so the sign of the reshape distance d1 is negative, d1<0 (in FIG. 24, only the absolute value of d1 is indicated). The resulting polygon st1 is assigned the nominal dose.

FIG. 25 shows the (more usual) case of expanding the polygon t0 by a reshape distance d2. The process is basically the same as with the previous process discussed with FIG. 24, except that the vertices are shifted outwards from the original vertices tv1, tv2 of the polygon. Thus, each shifted vertex xv1, xv2, . . . is at a distance d2 to the respective original edges t01, t12, . . . , which distance corresponds to the reshape distance d2, but this time the shifted vertices are outside the start polygon t0. Likewise, the shifted edges x01, x12, . . . of the resulting polygon st2 are moved outwards, but again they all are at the same reshape distance d2 to the corresponding original edges t01, t12. The reshape distance d2 is determined from the value of the assigned dose of the polygon t0, using the predefined dose slope function $f_{SD}$ (see FIG. 21) with regard to the nominal dose; in this case, the assigned dose of the start polygon t0 is greater than the nominal dose, which is why reshape distance d2>0. The resulting polygon st2 is assigned the nominal dose.

This method of offsetting of polygons is an operation which is definite and unambiguous, and straightforward to implement. The angular bisectors ab1, ab2, . . . are parts of a construction which is called the "straight skeleton" of the polygon. One interesting feature of this method is that the straight skeletons of the original and resulting polygons t0, st1, st2 only comprises straight-line segments. In other words, this method does not produce curvilinear segments provided the original shape did not contain curvilinear segments. This characteristic is important where it is desired to reduce complexity, all the more in view of the fact that common vector formats in the semiconductor field do not support curvilinear segments. The fastest implementation of this offsetting method was demonstrated to have only O(n log n) time complexity and O(n) memory scaling (PhD thesis of Stefan Huber, op.cit.), where n denotes the number of polygon vertices.

In a second preferred embodiment, reshaping is done according to a procedure where, rather than moving vertices along angular bisectors of incident edges, the edges are moved by a given offset distance d3, and vortices are defined to join the edges as follows. Where subsequent shifted edges meet, the vortex is placed at the intersection. In the case that no intersection occurs, an interior (or exterior) offset curve is interpolated. This distinction is always possible where the amount of the offset distance d3 is not too large, namely, smaller than half of the smallest width (or "thickness") of the segment portions of the underlying polygon.

Figure 26:
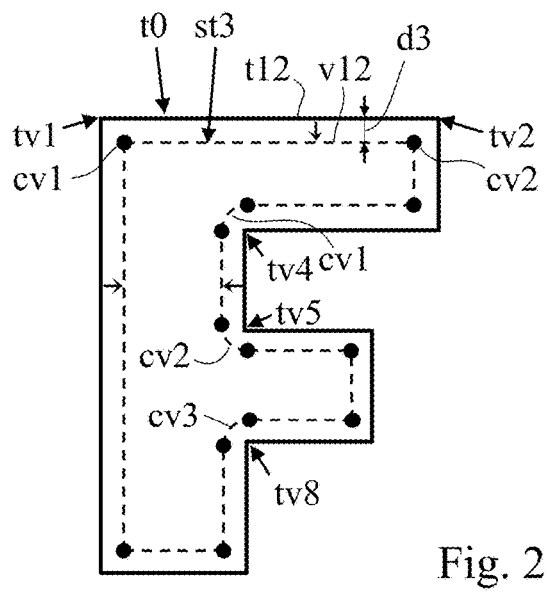
FIG. 26 illustrates a contracting reshaping of a pattern element according to a second aspect of the invention.

FIG. 26 illustrates the method of the second embodiment for the example of shrinking a start polygon t0 of the same shape as in FIGS. 24 and 25, by an offset distance d3. A result curve st3 is constructed at the uniform distance d3 relative to the positions (edges and vertices) of the start polygon t0. Thus, basically each of the original edges t12 will correspond to a respective shifted edge v12; however, as it is required that every point in the result curve st3 is located at the same distance d3 from the boundary of the start polygon t0, this may involve curvilinear segments. More specifically, such curvilinear segments will be interpolated at all vertices for which the inner angle spanned by the adjacent edges is larger than π. For instance, in the shrinking process illustrated in FIG. 26, curvilinear segments curv1, curv2, curv3 are inserted at the vertices tv4, tv5, and tv8, respectively. At the other vortices, such as vortices tv1 and tv2, it suffices to insert new shifted vortices cv1, cv2 at the intersections of the shifted edges, and shorten the edges as needed. (The resulting shifted vortices cv1, cv2 at convex components will coincide with vortices sv1, sv2 which are obtained through the offsetting method illustrated in FIG. 24, when the using d3 as reshape distance in place of d1.)

Figure 27:
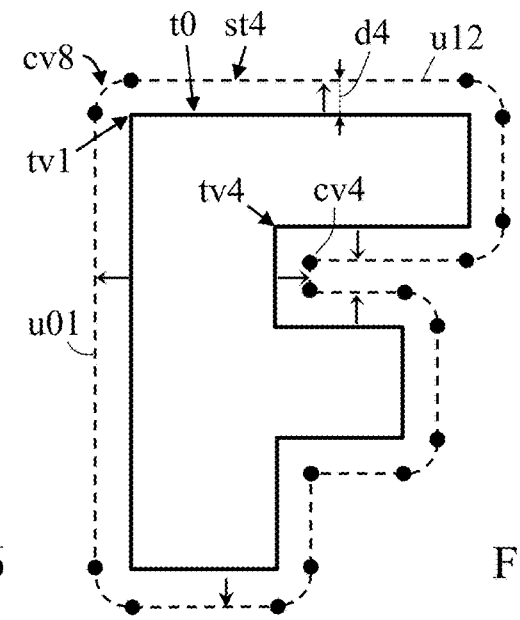
FIG. 27 illustrates an expanding reshaping of a pattern element according to the second aspect.

Conversely, an expansion, e.g. by an offset distance d4 outwards as shown in FIG. 27, leads to rounded segments at all convex vertices, i.e., vertices where the inner angle spanned by the adjacent edges is lower than π. In the example shown in FIG. 27, a curvilinear segment cv8 is inserted at the convex vortex tv1, and likewise for the other convex vortices. For the concave vortices, it is sufficient to provide shifted vertex points, as can be seen, e.g., at the shifted vortex cv4, in the resulting expanded polygon st4.

Figure 28:
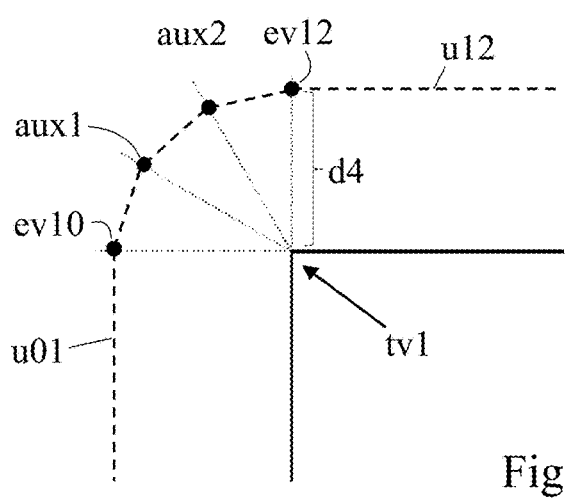
FIG. 28 is a detail of FIG. 27 illustrating the construction at one of the convex edges.

This method is closely related to Voronoi diagrams (for one implementation see P. Palfrader & M. Held in *Computer-Aided Design & Applications*, 12(4), 2015, 414-424, available through http://dx.doi.org/10.1080/16864360.2014.997637). While implementations to realize such transformations are available, with complexity in time and memory comparable to the skeleton method previously described, the fact that this method leads to curvilinear segments may be problematic when dealing with vector formats that do not support such segments. One way of simplifying this kind of situation is by approximating curvilinear segments by a discrete approximation of the curvilinear segment, such as a number of linear segments spanned by auxiliary vortices aux1, aux2 which are interpolated between the end vortices ev10, ev12 of the respective shifted edges u01, u12 as illustrated in FIG. 28 at the distance d4 to the respective vortex.

Note that the methods illustrated in FIGS. 24 to 28 are also applicable to closed polygons containing ring-like structures or "holes". As is obvious to the skilled person, for the perimeters of "holes", the connection between the direction of the movement inwards/outwards and the desired operation contracting/expanding are simply inversed.

Reshaping in the Pixel Domain

In another embodiment of the invention, the shape corrections are performed in the pixel domain. Pixel domain corrections are advantageous in particular if the same shape correction is to be applied to all pattern elements that lie within the beam area, and a distinction of different pattern elements with respect to individual shape correction factors is not needed. One simple way to realize the reshaping based on pixel data is to first perform edge detection to transform back the pixel data to vector data, using a well-known edge-detection algorithm, then reshape the vector data as described above and re-rasterize. Another possibility is to reshape directly in the pixel domain, which may be computationally advantageous. Pixel-based size adjustments can be performed, for instance, using grayscale morphological image processing, a well-established tool-kit which provides similar functionality to the vector operations above in the pixel domain (see e.g. Shih, Frank Y. *Image processing and mathematical morphology: fundamentals and applications*. CRC press, 2009, pp. 28-30). Of particular interest are the morphological operations dilation ⊕ and erosion ⊖. For a grayscale image f(x) (here, the rasterized pattern) in an image domain (or grid) Ω and a structuring function b(x), they are defined by $$(f \oplus b)(x) = \max_{y \in \Omega} \ f(y) + b(x - y)$$

$$(f \ominus b)(x) = \min_{y \in \Omega} \ f(y) - b(x - y).$$

In particular, for a structuring element $B_k$ that is 2k+1 pixels wide orthogonal to the edge direction (e.g. a 2k+1 pixel wide square or 2k+1 pixel wide circle centered at 0), using a flat structuring function $$b_k(x) = \begin{cases} 0 & \text{for } x \in B_k \\ -\infty & \text{otherwise} \end{cases}$$

generates an edge shift of k pixels to the outside by dilation, obtaining $f_k = f \oplus b_k$. Likewise, an edge shift of k pixels to the inside can be generated by erosion to get $f_{-k} = f \ominus b_k$. Note that computationally the area where the maximum/minimum in the expressions for $f \oplus b_k$ or $f \ominus b$ is calculated is restricted (e.g. to a box where $b_k(x) \neq -\infty$).

Figure 30:
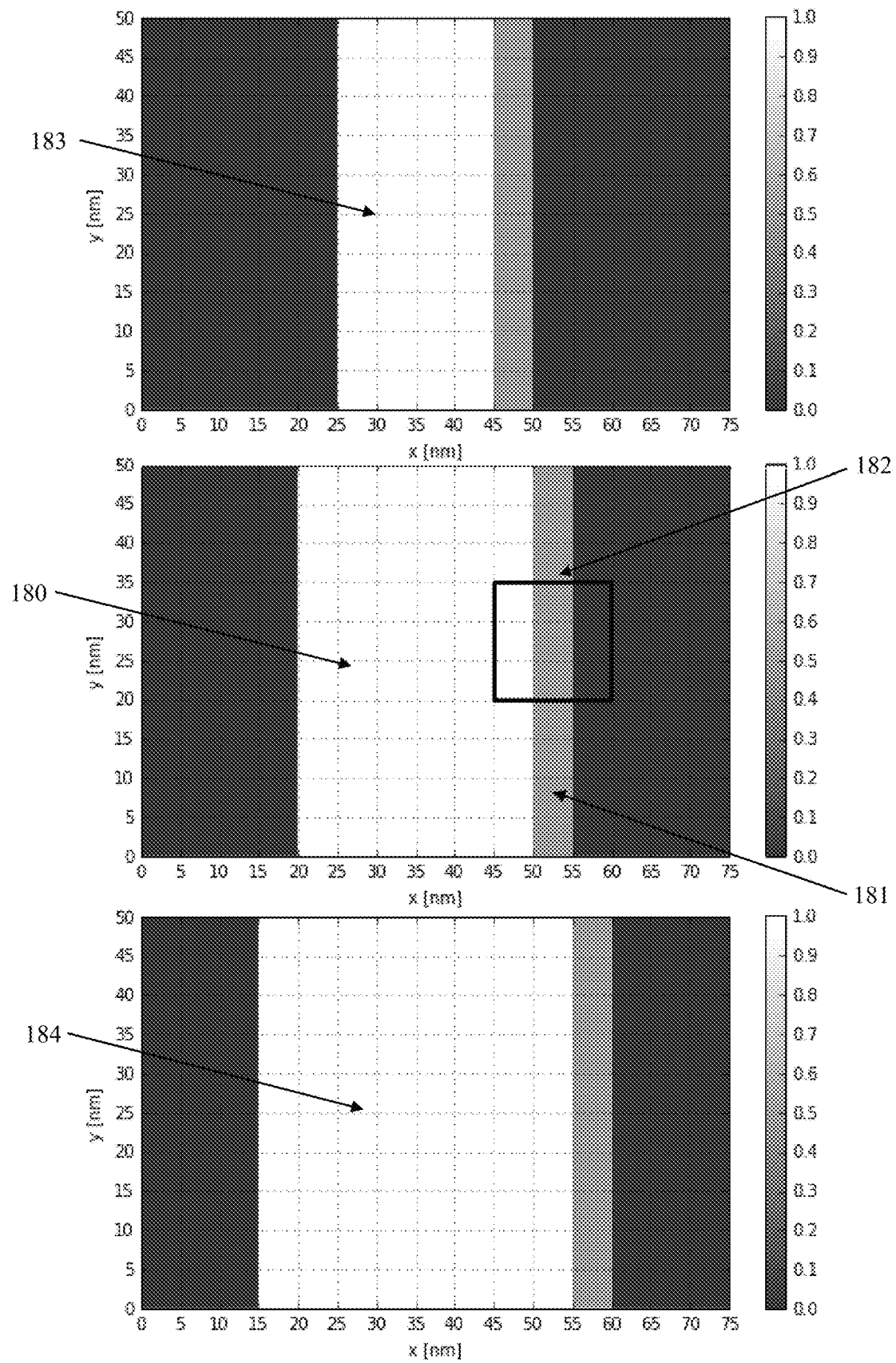
FIG. 30 illustrates a realization of the reshaping method performed on a line pattern in the pixel domain.

An example is given in FIG. 30 for a quad-grid (o=4) exposure with 20 nm apertures, resulting in a pixel size of 5 nm. The images show dose assignments between 0 (no dose, dark squares) and 1 (nominal dose, light squares), for every pixel (indicated by the dashed grid) in a 75×50 nm field (e.g. using 16 gray-levels). The middle frame of FIG. 30 shows a 32.5 nm line 180. This line 180 is modified by operating on the image f(x) which represents the line using a flat structuring function b(x) generated from a structuring element 182 (a square of 3×3 pixels). Note that the (normalized) dose assignment 181 on the right edge is only 0.5 since the line width is not a multiple of the pixel size (thus, the right edge is shifted by 2.5 nm, i.e. a half pixel, relative to a full-pixel width). The top frame and the bottom frame of FIG. 30 respectively depict the eroded line 183 (with corresponding image $f_{-1}$) and dilated line 184 (image $f_1$) as obtained by this method. In particular, the dilated line is a full pixel (5 nm) wider at both edges, since the structuring element 182 is a 3×3 pixel square (i.e. k=1).

Figure 31:
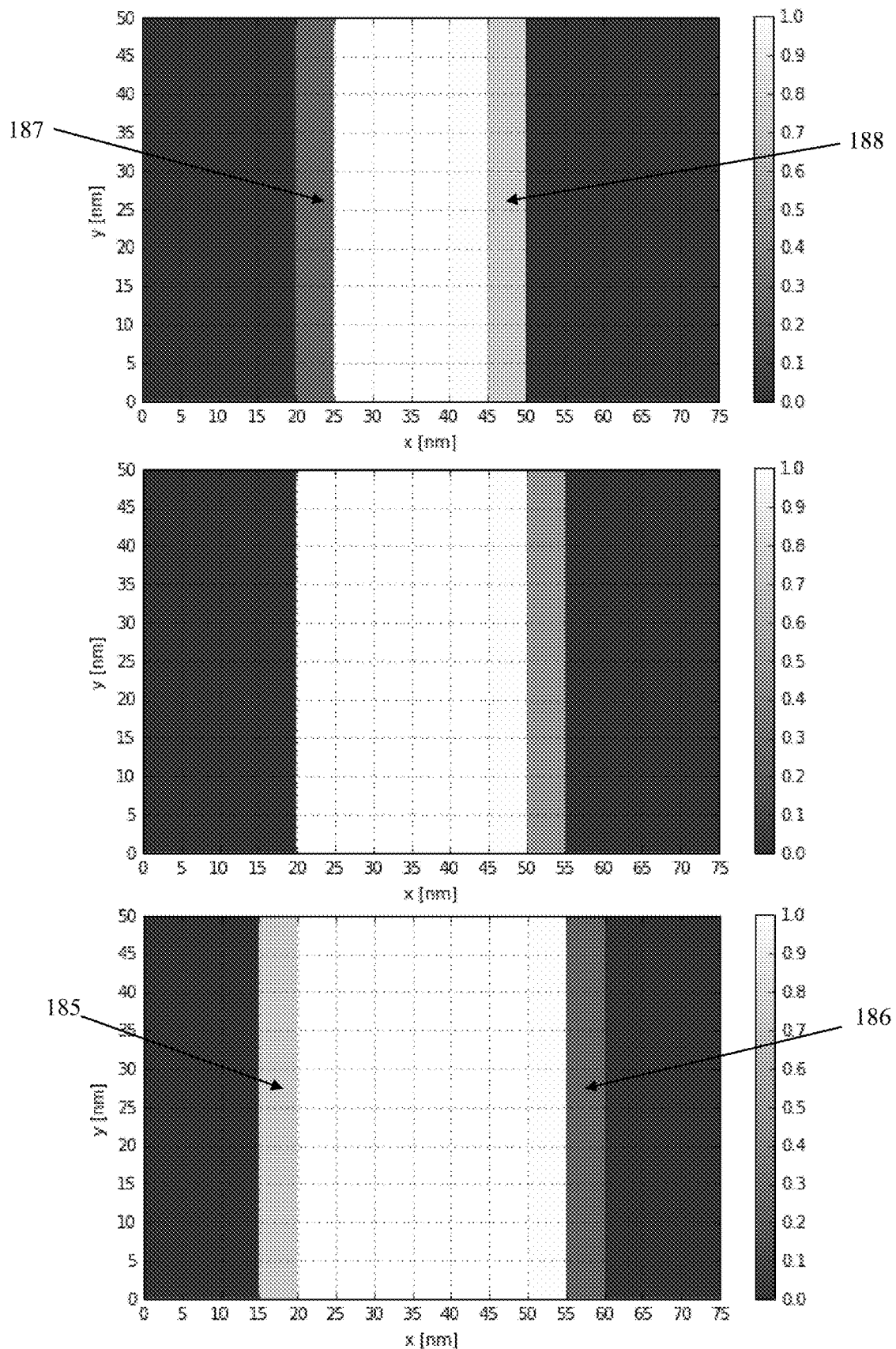
FIG. 31 illustrates how the reshaping method performed on a line pattern in the pixel domain is done for a reshape distance value which is not an integer multiple of the pixel size, FIG. 32A,B,C illustrate the degradation of critical dimension uniformity for dose settings deviating from the isofocal dose for the preferred write mode comprising overlapping pixels.

To obtain sub-pixel edge shifts, a customized approach has to be used. To dilate a grayscale image f (assuming it has a normalized nominal dose of 1) by a fraction 0<q<1 of a pixel, take a 3×3 pixel square $B_3$ and use $$f_q = \min(f + f \oplus b_q, 1 - bg) \text{ where } b_q(x) = \begin{cases} (q-1)(1-bg) & \text{for } x \in B_3 \\ -\infty & \text{otherwise} \end{cases},$$

where bg is the dose background due to proximity effect. To perform an arbitrary size change k+q for integer k, 0<q<1, first a full-pixel dilation or erosion operation is performed, so as to obtain an intermediate image $f_k$, followed by a fractional dilation, obtaining $f_{k+q} = (f_k)_q$. An example is given in FIG. 31 (for bg=0). The middle frame shows the same 32.5 nm line 180 as in FIG. 30, which is to be dilated and eroded by a ¾ pixel, respectively (to get edge shifts of 3.75 nm directed outwards and inwards, respectively), as shown in the bottom and top frames of FIG. 31. By virtue of the dose assignment 0.25 at the right edge 186 in the bottom frame, the right edge moves ½+¼=¾ pixel. Similarly, by the dose assignment 0.75 at the left edge 185, the edge moves a ¾ pixel (see U.S. Pat. No. 8,222,621). To shift the edges a ¾ pixel inwards in the top frame of FIG. 30, first, a 1 pixel erosion is performed, followed by a ¼ pixel dilation. As before, the resulting dose assignment 0.25 at the left edge 187 and 0.75 at the right edge 188 lead to edge shifts of a ¾ pixel, but this time inwards.

Since the necessary size corrections (based on the assigned doses) are generally given in the vector domain, they have to be translated to pixel-based maps prior to resizing (e.g. by storing a size assignment scalar of a pixel during rasterization).

Reshaping Based on Position on the Target

Figure 29:
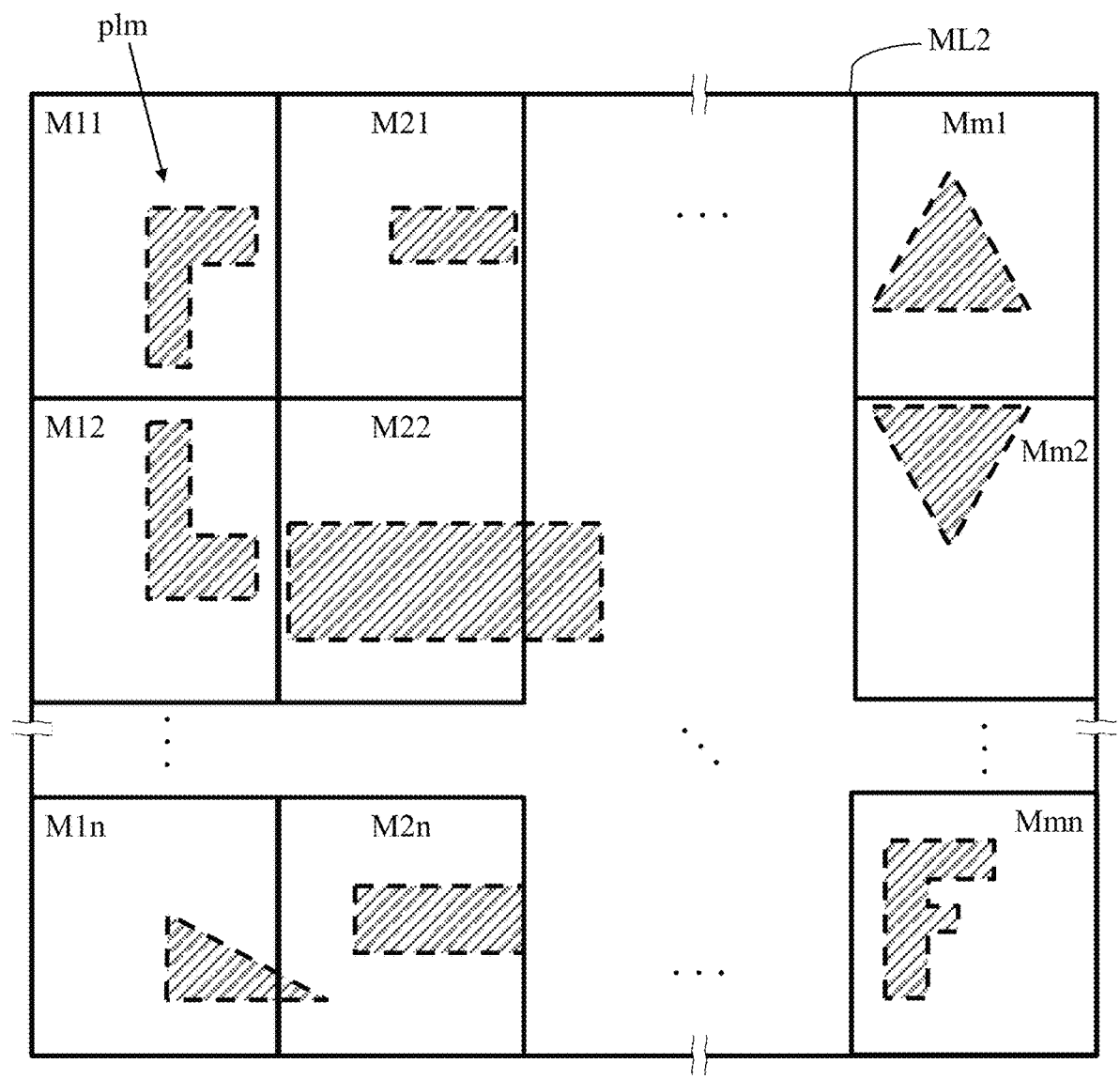
FIG. 29 shows an exposure region where the reshaping is done depending on different areas in the exposure region.

In a variant, the reshaping may be performed based on the position of the respective pattern element on the target. FIG. 29 illustrates on example of a region of exposure ML2 on a target, which comprises a pattern plm having a number of pattern elements. In this case, assigned values of exposure dose are not associated with the pattern elements of the pattern plm, but with different areas in the region of exposure ML2. For this, the region ML2 is divided into a number of areas M11, M21, . . . Mm1, M12, M22, . . . Mm2, . . . Mmn, which preferably (but not necessarily) are of equal shape. For each of the areas M11-Mmn, a reshape value is defined regardless of a possible pattern plm within the region of exposure ML2. Reshaping in each of the areas is done with the reshape value as reshaping distance for all pattern elements located in the respective area. In other words, the determination of the reshape distance is made as if all pattern elements in an area have the same initial assigned dose. The definition of the areas M11-Mmn and the associated values of the reshape distance are usually provided by the user during design of the pattern or a correction step for the pattern data based on experimental data.

In the case that a pattern element extends from one area to another, the reshaped pattern element is smoothed at the transition between areas, or an averaged value of the areas is used for the pattern element.

In another variant, the reshaping may be performed based on the position of the respective pattern element in the beam field, i.e. the location within the structured beam. In this case areas are defined within the beam field, in an analogous manner as with the method described above with FIG. 29, but the areas and position of pattern elements are taken with regard to the beam field rather than the target.

Time-Dependent Reshaping

Figure 33:
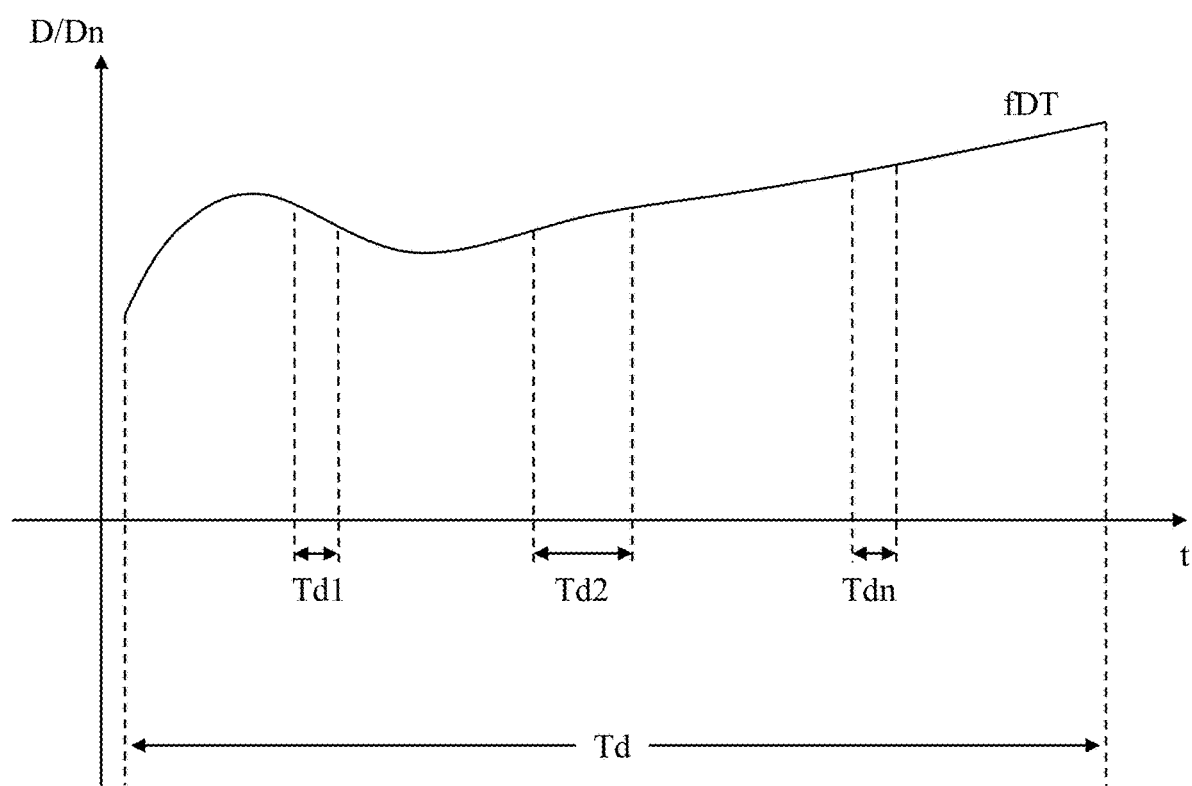
FIG. 33 illustrates the correlation of the relative dose D/Dn with time domain and time subdomains, showing that, once this correlation is known, reshaping values can be assigned to each subdomain independently by duration and starting time of subdomain.

FIG. 33 illustrates a recalculation of a pattern employing a time-dependent reshaping. Such reshaping dependent on time t may be applied to compensate factors that have a predictable drift of the relative dose D/Dn during the timespan of an exposure process or a sub-interval thereof. Examples include increase in beam blur due to thermal expansion of the MBMW components during exposure, photoresist heating due to prolonged exposure, aging or drifting of components like electron gun or pattern definition device during the lifespan of the same, among various others. In general for each of these cases, a time domain Td can be defined in which a certain event starts and ends (e.g. a mask blank exposure or the lifespan of a component). A function fDT that describes the time-evolution of the relative dose (D/Dn)(t) (see FIG. 33) can be derived based on experimental data, theory or simulated behavior. Within the time domain Td, several subdomains Td1, Td2 . . . Tdn may be defined, and a constant D/Dn value is assigned to each one of them by averaging, $(D/Dn)(Tdn)=Avg(fDT(Tdn))$, where Avg symbolizes averaging over the duration of the respective subdomain Tdn. Thus, a reshaping value can be calculated accordingly to fDS for each Tdn. All the patterns pll, plm written within a subdomain Tdn will be corrected according to the reshaping value assigned to Tdn. The time and extent of a subdomain can be chosen in accordance with an event timespan and the duration of single sub-events happening within the main event. Thus, the subdomains Td1, . . . Tdn do not have to be consecutive nor have the same duration. As an example: if the main event is the period of use or lifespan of a component (for instance, an electron gun which shows significant drift during the duration of a writing process), the time domain Td corresponds to this lifespan and a convenient division in subdomains may be Td1, . . . Tdn corresponding to a respective one of several exposures happening during the time domain Td.

What is claimed is:

1. Method for re-calculating a pattern to be exposed on a target by means of a charged-particle multi-beam writing apparatus, said apparatus exposing a multitude of pixels within an exposure region on the target to generate said pattern by means of a scanning stripe exposure where a structured beam composed of a plurality of beamlets is directed onto the target and moved along a path over the exposure region wherein between subsequent exposure steps the structured beam is shifted on the target by consecutive distances corresponding to an exposure length which is smaller than the width of the structured beam on the target, wherein the pattern initially comprises a number of pattern elements, wherein each pattern element has a respective shape comprising a boundary and an interior, and is associated with a respective assigned dose defining a value of exposure dose to be exposed for the pixels of the interior of the respective shape, wherein re-calculating of said pattern is done with regard to a nominal dose which represents a predefined standard value of exposure dose to be exposed for pixels of a maximal exposure as specified for the scanning stripe exposure within said charged-particle multi-beam writing apparatus, wherein, for at least one pattern element associated with an assigned dose deviating from the nominal dose, the pattern element is reshaped by determining a reshape distance from the value of the assigned dose with regard to the nominal dose based on a predefined dose slope function, forming a reshaped pattern element, said reshaped pattern element having boundary segments which are offset with regard to the locations of corresponding boundary segments of the pattern element by an offset distance equaling said reshape distance and in a direction perpendicular to the respective segments, and assigning the nominal dose to the reshaped pattern element, and replacing the pattern element by the reshaped pattern element, and a reshaped pattern is generated from the pattern by substituting the reshaped pattern elements for corresponding pattern elements.

2. Method according to claim 1, wherein the re-calculating is done for a pattern to be written with a writing process which generates aperture images on the target with the aperture images of subsequent exposure steps being mutually overlapping, and the aperture images having a nominal width which is a multiple of the distance between pixel positions of neighboring aperture images generated on the target, the method having the additional step of:

generating, from the reshaped pattern, a pixel exposure pattern suitable to expose the desired pattern by said writing process through exposure of pixels on the target by means of said aperture images.

3. Method according to claim 1, wherein reshaping of pattern elements is done with regard to a pixel representation of the pattern, wherein the step of forming a reshaped pattern element includes a combination of grayscale dilation and grayscale erosion steps to change a contour of the pattern element in said pixel representation by said reshape distance.

4. Method according to claim 1, wherein reshaping of pattern elements is done with regard to a pixel representation of the pattern, wherein the step of forming a reshaped pattern element includes detecting the locations of edges in the pixel representation and shifting the locations of the edges thus detected by said reshape distance along respective directions perpendicular to the respective edges.

5. Method according to claim 1, wherein the boundary of a pattern element is composed of a set of boundary segments which together define a closed loop surrounding the interior, and the step of forming a reshaped pattern element includes the steps of determining vertices of a polygon representation of the pattern element and angular bisectors at each of said vertices, calculating shifted vertices from said vertices, each of said shifted vertices being located at a shifted position such that the shifted vertex is at the reshape distance to the edges incident to the vertex, forming a reshaped pattern element by joining the shifted vertices to a closed loop, defining a shape of the reshaped pattern element using the closed loop, and assigning the nominal dose to the reshaped pattern element.

6. Method according to claim 1, wherein the boundary of a pattern element is composed of a set of boundary segments which together define a closed loop surrounding the interior, and the step of forming a reshaped pattern element includes the steps of determining reshaped boundary segments as segments obtained from the boundary segments of the pattern element by shifting the locations of the segments by said reshape distance along respective directions perpendicular to the respective segments, forming a reshaped pattern element by joining the reshaped boundary elements to a closed loop, defining a shape of the reshaped pattern element using the closed loop.

7. Method according claim 1, wherein the nominal dose represents the maximal exposure dose which is attainable for pixels during the scanning stripe exposure within said charged-particle multi-beam writing apparatus.

8. Method according to claim 1, wherein the nominal dose is the double of the positive exposure dose, which represents the minimal value of exposure dose which, when imparted to a pixel, is required to cause lithographic development of said pixel.

9. Method according to claim 1, wherein the nominal dose is an isofocal dose, which represents a value of exposure dose where a position of a contour between an area exposed at such exposure dose value and an area of zero exposition is independent of the amount of blur of the beam used for exposure during the scanning stripe exposure in the charged-particle multi-beam writing apparatus.

10. Method according to claim 1, wherein the step of determining a reshape distance is performed based on a predefined dose slope function which describes the reshape distance as a function of the value of the assigned dose relative to the nominal dose.

11. Method according to claim 10, wherein said function of the value of the assigned dose relative to the nominal dose is a linear function using a dose slope number.

12. Method according to claim 1, wherein reshaping of a pattern element is done for each pattern element having an assigned dose deviating from the nominal dose by at least a predefined deviation factor relative to the nominal dose.

13. Method according to claim 1, wherein the exposure length, applied as an offset distance between subsequent exposure steps, is uniform, and the exposure length corresponds to a multiple of at least two of the spacing between neighboring beamlets along the direction of the exposure length in the structured beam, so as to have the plurality of beamlets expose consecutively different pixels whereas pixels in the exposure region are exposed by a sequence of beamlets during subsequent exposure steps.

14. Method of claim 13, wherein said multiple of at least two is an integer multiple of the spacing between neighboring beamlets along the direction of the exposure length in the structured beam.

* * * * *